(12) United States Patent
Choi

(10) Patent No.: US 9,666,765 B2
(45) Date of Patent: May 30, 2017

(54) DISPLAY DEVICE USING SEMICONDUCTOR LIGHT EMITTING DEVICE AND METHOD OF MANUFACTURING THE SAME

(71) Applicant: LG ELECTRONICS INC., Seoul (KR)

(72) Inventor: Hwanjoon Choi, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 14/857,563

(22) Filed: Sep. 17, 2015

(65) Prior Publication Data

US 2016/0293805 A1    Oct. 6, 2016

(30) Foreign Application Priority Data

Mar. 30, 2015    (KR) .................... 10-2015-0044420

(51) Int. Cl.
*H01L 29/18* (2006.01)
*H01L 33/50* (2010.01)
*H01L 25/075* (2006.01)
*H01L 33/08* (2010.01)
*H01L 33/62* (2010.01)

(52) U.S. Cl.
CPC .......... *H01L 33/50* (2013.01); *H01L 25/0753* (2013.01); *H01L 33/08* (2013.01); *H01L 33/504* (2013.01); *H01L 33/505* (2013.01); *H01L 33/507* (2013.01); *H01L 33/62* (2013.01); *H01L 2933/0041* (2013.01)

(58) Field of Classification Search
CPC .............................. H01L 33/502; H01L 33/50
USPC ........................................................... 257/88
See application file for complete search history.

(56) References Cited

U.S. PATENT DOCUMENTS

| | | | |
|---|---|---|---|
| 2009/0101930 A1* | 4/2009 | Li .......................... | G02B 6/005 257/98 |
| 2011/0260192 A1* | 10/2011 | Kwak ..................... | H01L 33/56 257/98 |
| 2015/0171372 A1* | 6/2015 | Iwata ...................... | C09D 5/22 257/40 |
| 2015/0207043 A1* | 7/2015 | Pfeuffer ................ | H01L 27/156 438/29 |
| 2015/0221619 A1 | 8/2015 | Rhee | |
| 2015/0228865 A1 | 8/2015 | Rhee | |

FOREIGN PATENT DOCUMENTS

| | | |
|---|---|---|
| DE | 10 2012 106 859 A1 | 1/2014 |
| EP | 2423736 A1 | 2/2012 |
| KR | 10-2014-0025055 A | 3/2014 |
| KR | 10-1422037 B1 | 7/2014 |

(Continued)

*Primary Examiner* — Julia Slutsker
(74) *Attorney, Agent, or Firm* — Birch, Stewart, Kolasch & Birch, LLP

(57) ABSTRACT

A display device including a plurality of semiconductor light emitting devices mounted on a substrate, and a phosphor layer including a plurality of phosphor portions configured to convert a wavelength of light and a plurality of partition wall portions formed between the plurality of phosphor portions. Further, a least one of the plurality of partition wall portions overlaps with at least one of the plurality of semiconductor light emitting devices along a thickness direction of the phosphor layer.

15 Claims, 24 Drawing Sheets

(56) References Cited

FOREIGN PATENT DOCUMENTS

| KR | 10-1476207 B1 | 12/2014 |
|----|---------------|---------|
| TW | 201104914 A1 | 2/2011 |
| WO | WO 2014/030830 A1 | 2/2014 |

* cited by examiner

DISPLAY DEVICE USING SEMICONDUCTOR LIGHT EMITTING DEVICE AND METHOD OF MANUFACTURING THE SAME

CROSS-REFERENCE TO RELATED APPLICATIONS

This application claims the benefit of priority to Korean Patent Application No. 10-2015-0044420, filed on Mar. 30, 2015, the contents of which is herein expressly incorporated by reference in its entirety.

BACKGROUND OF THE INVENTION

1. Field of the Invention

The present disclosure relates to a display device and a fabrication method thereof, and more particularly, to a flexible display device using a semiconductor light emitting device.

2. Description of the Related Art

In recent years, display devices having excellent characteristics such as low profile, flexibility and the like have been developed. Currently commercialized main displays are represented by liquid crystal displays (LCDs) and active matrix organic light emitting diodes (AMOLEDs). However, there exist problems such as slow response time, difficult implementation of flexibility for LCDs, and there exist drawbacks such as a short life span, poor yield as well as low flexibility for AMOLEDs.

Further, light emitting diodes (LEDs) are light emitting devices for converting an electrical current to light, and have been used as a light source for displaying an image in an electronic device including information communication devices since red LEDs using GaAsP compound semiconductors were made commercially available in 1962, together with a GaP:N-based green LEDs. Accordingly, the semiconductor light emitting devices may be used to implement a flexible display, thereby presenting a scheme for solving the problems.

The structure of exciting light emitted from the semiconductor light emitting device using a phosphor layer may be applicable to a flexible display using the semiconductor light emitting device. In this instance, a partition wall structure for preventing color mixture may be provided on the phosphor layer, but this may cause various problems during the fabrication due to the partition wall structure.

SUMMARY OF THE INVENTION

An aspect of the present disclosure is to provide a structure of phosphor layer and a fabrication method thereof capable of increasing a filling space of the phosphor layer in a display device.

Another aspect of the present disclosure is to provide a display device with flexibility having a new type of partition wall structure which is different from the related art.

A display device according to the present disclosure may include a plurality of semiconductor light emitting devices mounted on a substrate, and a phosphor layer provided with a plurality of phosphor portions configured to convert the wavelength of light and a plurality of partition wall portions formed between the plurality of phosphor portions, and disposed to cover the plurality of semiconductor light emitting devices, wherein a least one of the plurality of partition wall portions overlaps with at least one of the plurality of semiconductor light emitting devices along a thickness direction of the phosphor layer.

According to an embodiment, the plurality of partition wall portions may include a first partition wall portion disposed to cover between the plurality of semiconductor light emitting devices and a second partition wall portion configured to cover at least one of the plurality of semiconductor light emitting devices.

According to an embodiment, at least one of the plurality of semiconductor light emitting devices covered by the second partition wall portion may include a blue semiconductor light emitting device.

At least part of the plurality of phosphor portions may be disposed with the first partition wall portion therebetween, and the at least part of phosphor portions may include at least one of a red phosphor, a green phosphor and a yellow phosphor.

According to an embodiment, the first partition wall portion and the second partition wall portion may be formed to have different sizes of width formed along a direction perpendicular to a thickness direction of the phosphor layer. The first partition wall portion may have a size of width smaller than that of the second partition wall portion.

According to an embodiment, the plurality of partition wall portions may be configured to cover a pair of semiconductor light emitting devices disposed adjacent to each other together among the plurality of semiconductor light emitting devices.

The plurality of semiconductor light emitting devices may include at least one semiconductor light emitting device configured to form red (R), green (G) and blue (B) subpixels along with the pair of semiconductor light emitting devices, and at least one of the plurality of phosphor portions may be configured to cover the at least one semiconductor light emitting device.

According to an embodiment, at least one of the plurality of partition wall portions may include one or more metal thin films formed at an edge thereof, and a light transmitting material is filled between the metal thin films.

The metal thin films may be formed to cover a lateral surface of the phosphor portions to reflect light from the metal thin film. An insulating layer may be formed between the metal thin film and the light transmitting material.

According to an embodiment, at least one of the plurality of partition wall portions may include a base portion extended along a first direction, and a protrusion portion protruded in a second direction perpendicular to the first direction from an end portion of the base portion.

According to an embodiment, at least one of the plurality of partition wall portions may include one or more metal thin films formed at an edge thereof, and a metal thin film formed on the base portion and a metal thin film formed on the protrusion portion may be formed to have different lengths along a thickness direction of the phosphor layer. A distance to the substrate for a metal thin film formed on the protrusion portion may be configured to be greater than that for a metal thin film formed on the base portion.

According to an embodiment, the protrusion portion may be disposed to overlap with at least part of a wiring electrode of the semiconductor light emitting device in a thickness direction of the phosphor layer.

According to an embodiment, at least one of the plurality of partition wall portions may be separated from an adjoining partition wall portion along the first direction or the second direction.

Furthermore, the present disclosure discloses a fabrication method of a display device, and the method may include coupling a plurality of semiconductor light emitting devices to a substrate, and forming a phosphor layer disposed to cover the plurality of semiconductor light emitting devices, wherein the phosphor layer comprises a plurality of phosphor portions configured to convert the wavelength of light and a plurality of partition wall portions formed between the plurality of phosphor portions, and a least one of the plurality of partition wall portions overlaps with at least one of the plurality of semiconductor light emitting devices along a thickness direction of the phosphor layer.

According to an embodiment, said forming the phosphor layer may include coating a light transmitting material on the plurality of semiconductor light emitting devices, and etching the light transmitting material, and filling a phosphor into a portion from which the light transmitting material is etched to create the phosphor portions, wherein the light transmitting material is non-etched on a portion corresponding to at least one of the plurality of semiconductor light emitting devices.

According to an embodiment, said forming the phosphor layer may further include etching the light transmitting material, and then depositing a metal thin film on the light transmitting material, and removing at least part of the metal thin film to transmit light emitted from the semiconductor light emitting device to a portion corresponding to at least one of the plurality of semiconductor light emitting devices.

According to an embodiment, at least one of the plurality of partition wall portions may include a base portion, and a protrusion portion protruded from an end portion of the base portion to hide at least part of the light transmitting material along a deposition direction of the metal thin film.

According to a display device in accordance with the present disclosure, at least one of a plurality of partition wall portions may overlap with at least one of a plurality of semiconductor light emitting devices, thereby further securing a space into which a phosphor is filled.

Furthermore, the present disclosure may implement a partition wall portion suitable to a display having flexible characteristics. Through this, a flexible material may be used for a partition wall portion due to a light transmitting material, and moreover, light emitted from a semiconductor light emitting device may be transmitted in a thickness direction of the phosphor layer. Accordingly, in case of emitting blue light, it is allowed to have a structure in which a partition wall portion overlaps with a blue semiconductor light emitting device.

Furthermore, the present disclosure may perform deposition using a deposition angle during the coating of a metal thin film, and allow the partition wall portion to have a protrusion portion, thereby securing a separation distance between the metal thin film and a wiring line of the semiconductor light emitting device.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

Figure 1:
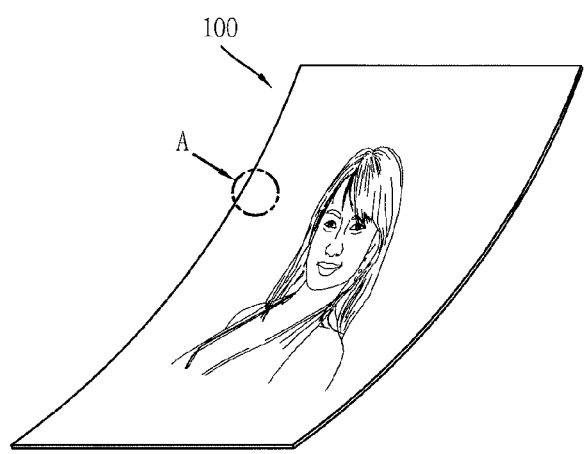
FIG. 1 is a conceptual view illustrating a display device using a semiconductor light emitting device according to an embodiment of the present disclosure.

Hereinafter, the embodiments disclosed herein will be described in detail with reference to the accompanying drawings, and the same or similar elements are designated with the same numeral references regardless of the numerals in the drawings and their redundant description will be omitted. A suffix "module" or "unit" used for constituent elements disclosed in the following description is merely intended for easy description of the specification, and the suffix itself does not give any special meaning or function. Also, it should be noted that the accompanying drawings are merely illustrated to easily explain the concept of the invention, and therefore, they should not be construed to limit the technological concept disclosed herein by the accompanying drawings. Furthermore, when an element such as a layer, region or substrate is referred to as being "on" another element, it can be directly on the another element or an intermediate element may also be interposed therebetween.

A display device disclosed herein may include a portable phone, a smart phone, a laptop computer, a digital broadcast terminal, a personal digital assistant (PDA), a portable multimedia player (PMP), a navigation, a slate PC, a tablet PC, an ultrabook, a digital TV, a desktop computer, and the like. However, it would be easily understood by those skilled in the art that a configuration disclosed herein may be applicable to any displayable device even though it is a new product type which will be developed later.

FIG. 1 is a conceptual view illustrating a display device 100 using a semiconductor light emitting device according to an embodiment of the present disclosure. Further, information processed in the controller of the display device 100 may be displayed using a flexible display.

The flexible display may include a flexible, bendable, twistable, foldable and rollable display. For example, the flexible display may be a display fabricated on a thin and flexible substrate that can be warped, bent, folded or rolled like a paper sheet while maintaining the display characteristics of a flat display in the related art.

A display area of the flexible display becomes a plane in a configuration that the flexible display is not warped (for example, a configuration having an infinite radius of curvature, hereinafter, referred to as a "first configuration"). The display area thereof becomes a curved surface in a configuration that the flexible display is warped by an external force in the first configuration (for example, a configuration having a finite radius of curvature, hereinafter, referred to as a "second configuration"). As illustrated in the drawing, information displayed in the second configuration may be visual information displayed on a curved surface. The visual information may be implemented by individually controlling the light emission of sub-pixels disposed in a matrix form. The sub-pixel denotes a minimum unit for implementing one color.

The sub-pixel of the flexible display may be implemented by a semiconductor light emitting device. According to the present disclosure, a light emitting diode (LED) is illustrated as a type of semiconductor light emitting device. The light emitting diode may be formed with a small size to perform the role of a sub-pixel even in the second configuration through this.

Hereinafter, a flexible display implemented using the light emitting diode will be described in more detail with reference to the accompanying drawings. In particular, FIG. 2 is a partial enlarged view of portion "A" in FIG. 1, and FIGS. 3A and 3B are cross-sectional views taken along lines B-B and C-C in FIG. 2, FIG. 4 is a conceptual view illustrating a flip-chip type semiconductor light emitting device in FIG. 3A, and FIGS. 5A through 5C are conceptual views illustrating various forms for implementing colors in connection with a flip-chip type semiconductor light emitting device.

Figure 2:
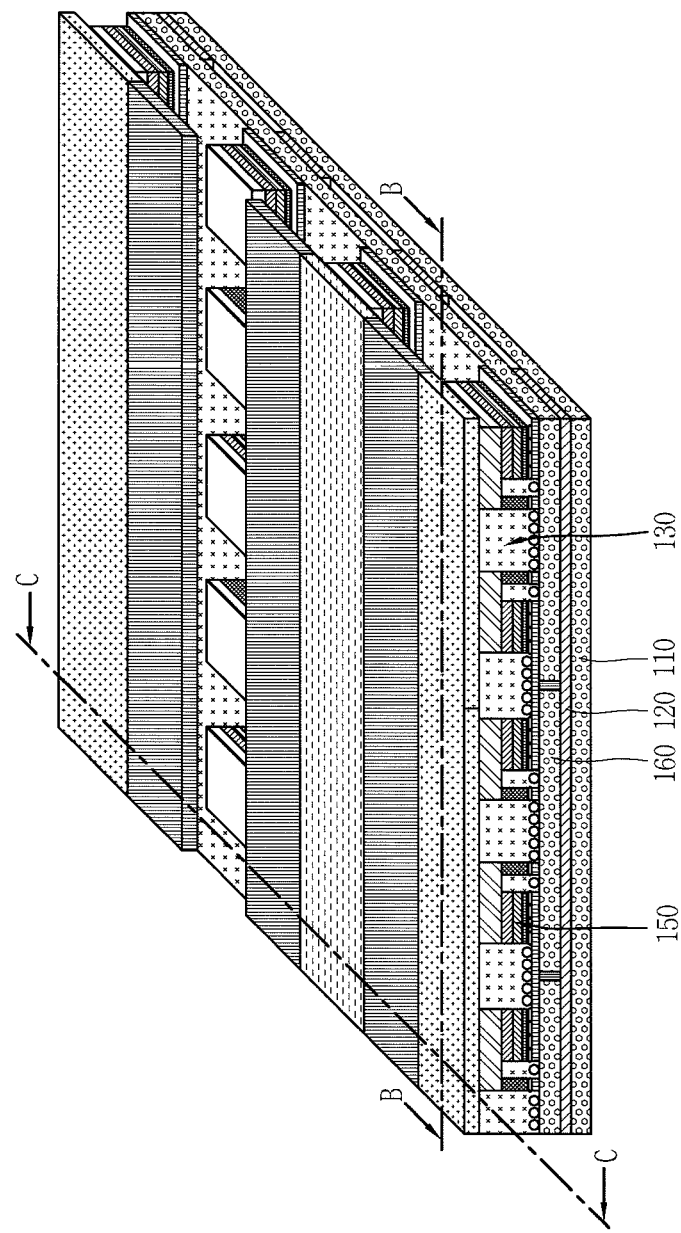
FIG. 2 is a partial enlarged view of portion "A" in FIG. 1, and FIGS. 3A and 3B are cross-sectional views taken along lines B-B and C-C in FIG. 2.
Figure 3A:
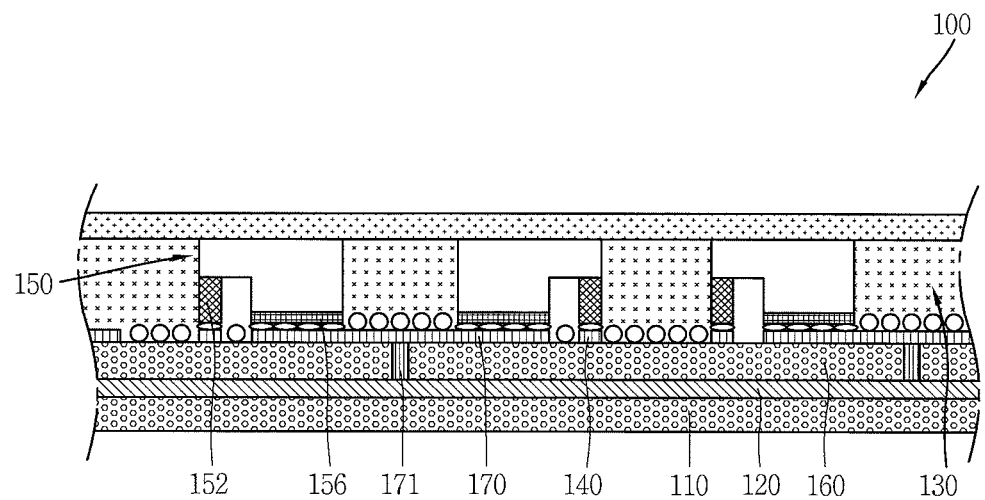
Figure 3B:
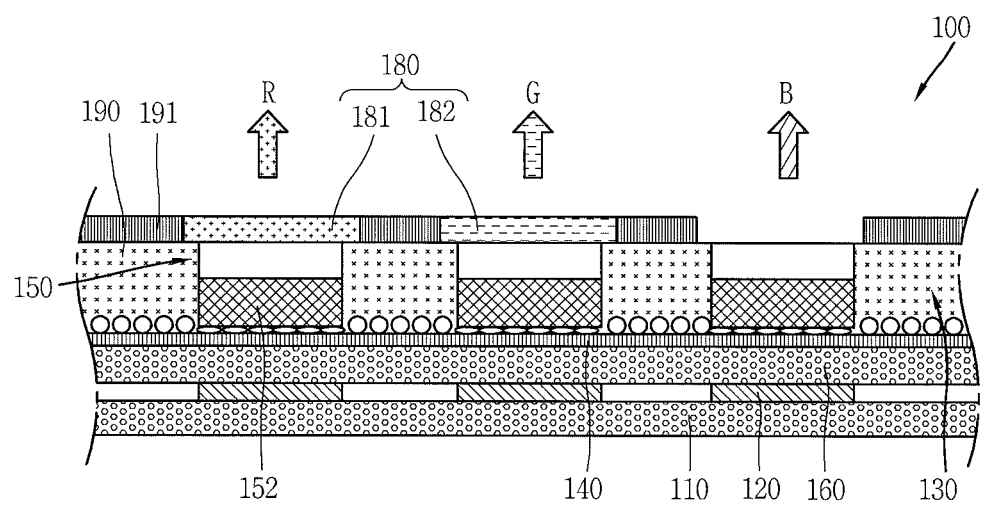
Figure 4:
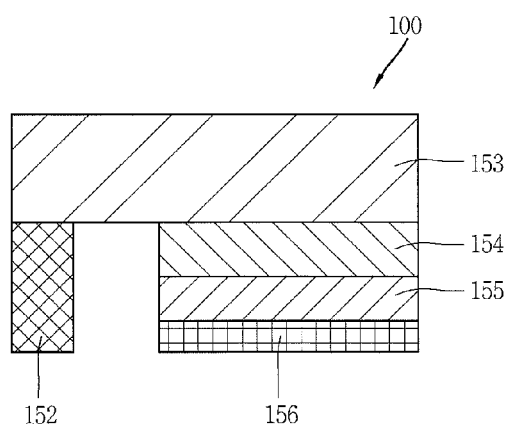
FIG. 4 is a conceptual view illustrating a flip-chip type semiconductor light emitting device in FIG. 3A.

According to the drawings in FIGS. 2, 3A and 3B, there is illustrated a display device 100 using a passive matrix (PM) type semiconductor light emitting device as the display device 100 using a semiconductor light emitting device. However, the following illustration may be also applicable to an active matrix (AM) type semiconductor light emitting device.

The display device 100 may include a substrate 110, a first electrode 120, a conductive adhesive layer 130, a second electrode 140, and a plurality of semiconductor light emitting devices 150. The substrate 110 may be a flexible substrate and contain glass or polyimide (PI) to implement the flexible display device. In addition, if it is a flexible material, any one such as polyethylene naphthalate (PEN), polyethylene terephthalate (PET) or the like may be used. Furthermore, the substrate 110 may be either one of transparent and non-transparent materials.

The substrate 110 may be a wiring substrate disposed with the first electrode 120, and thus the first electrode 120 may be placed on the substrate 110. According to the drawing, an insulating layer 160 may be disposed on the substrate 110 placed with the first electrode 120, and an auxiliary electrode 170 may be placed on the insulating layer 160. In this instance, a configuration in which the insulating layer 160 is deposited on the substrate 110 may be single wiring substrate. More specifically, the insulating layer 160 may be incorporated into the substrate 110 with an insulating and flexible material such as polyimide (PI), PET, PEN or the like to form single wiring substrate.

The auxiliary electrode 170 as an electrode for electrically connecting the first electrode 120 to the semiconductor light emitting device 150 is placed on the insulating layer 160, and disposed to correspond to the location of the first electrode 120. For example, the auxiliary electrode 170 has a dot shape, and may be electrically connected to the first electrode 120 by an electrode hole 171 passing through the insulating layer 160. The electrode hole 171 may be formed by filling a conductive material in a via hole.

Referring to the drawings, the conductive adhesive layer 130 may be formed on one surface of the insulating layer 160, but the present disclosure is not limited to this. For example, it is possible to also have a structure in which the conductive adhesive layer 130 is disposed on the substrate 110 with no insulating layer 160. The conductive adhesive layer 130 may perform the role of an insulating layer in the structure in which the conductive adhesive layer 130 is disposed on the substrate 110.

The conductive adhesive layer 130 may be a layer having adhesiveness and conductivity, and thus, a conductive material and an adhesive material may be mixed on the conductive adhesive layer 130. Furthermore, the conductive adhesive layer 130 may have flexibility, thereby allowing a flexible function in the display device.

For example, the conductive adhesive layer 130 may be an anisotropic conductive film (ACF), an anisotropic conductive paste, a solution containing conductive particles, and the like. The conductive adhesive layer 130 may allow electrical interconnection in the z-direction passing through the thickness thereof, but may be configured as a layer having electrical insulation in the horizontal x-y direction thereof. Accordingly, the conductive adhesive layer 130 may be referred to as a z-axis conductive layer (however, hereinafter referred to as a "conductive adhesive layer").

The anisotropic conductive film is a film with a form in which an anisotropic conductive medium is mixed with an insulating base member, and thus when heat and pressure are applied thereto, only a specific portion thereof may have conductivity by means of the anisotropic conductive medium. Hereinafter, heat and pressure are applied to the anisotropic conductive film, but other methods may be also available for the anisotropic conductive film to partially have conductivity. The methods may include applying only either one of heat and pressure thereto, UV curing, and the like.

Furthermore, the anisotropic conductive medium may be conductive balls or particles. According to the drawing, in the present embodiment, the anisotropic conductive film is a film with a form in which an anisotropic conductive medium is mixed with an insulating base member, and thus when heat and pressure are applied thereto, only a specific portion thereof may have conductivity by means of the conductive balls. The anisotropic conductive film may be in a state in which a core with a conductive material contains a plurality of particles coated by an insulating layer with a polymer material, and in this instance, it may have conductivity by means of the core while breaking an insulating layer on a portion to which heat and pressure are applied. Here, a core may be transformed to implement a layer having both surfaces to which objects contact in the thickness direction of the film.

For a more specific example, heat and pressure are applied to an anisotropic conductive film as a whole, and electrical connection in the z-axis direction is partially formed by a height difference from a mating object adhered by the use of the anisotropic conductive film. In another example, an anisotropic conductive film may be in a state containing a plurality of particles in which a conductive material is coated on insulating cores. In this instance, a portion to which heat and pressure are applied may be converted (pressed and adhered) to a conductive material to have conductivity in the thickness direction of the film. For still another example, it may be formed to have conductivity in the thickness direction of the film in which a conductive material passes through an insulating base member in the z-direction. In this instance, the conductive material may have a pointed end portion.

According to the drawing, the anisotropic conductive film may be a fixed array anisotropic conductive film (ACF) configured with a form in which conductive balls are inserted into one surface of the insulating base member. More specifically, the insulating base member is formed of an adhesive material, and the conductive balls are intensively disposed at a bottom portion of the insulating base member, and when heat and pressure are applied thereto, the base member is modified along with the conductive balls, thereby having conductivity in the vertical direction thereof.

However, the present disclosure is not limited to this, and the anisotropic conductive film may be all allowed to have a form in which conductive balls are randomly mixed with an insulating base member or a form configured with a plurality of layers in which conductive balls are disposed at any one layer (double-ACF), and the like. The anisotropic conductive paste as a form coupled to a paste and conductive balls may be a paste in which conductive balls are mixed with an insulating and adhesive base material. Furthermore, a solution containing conductive particles may be a solution in a form containing conductive particles or nano particles.

Referring to the drawing again, the second electrode 140 is located at the insulating layer 160 to be separated from the auxiliary electrode 170. In other words, the conductive adhesive layer 130 is disposed on the insulating layer 160 located with the auxiliary electrode 170 and second electrode 140.

When the conductive adhesive layer 130 is formed when the auxiliary electrode 170 and second electrode 140 are located, and then the semiconductor light emitting device 150 is connect thereto in a flip chip form with the application of heat and pressure, the semiconductor light emitting device 150 is electrically connected to the first electrode 120 and second electrode 140.

Referring to FIG. 4, the semiconductor light emitting device 100 may be a flip chip type semiconductor light emitting device. For example, the semiconductor light emitting device 100 may include a p-type electrode 156, a p-type semiconductor layer 155 formed with the p-type electrode 156, an active layer 154 formed on the p-type semiconductor layer 155, an n-type semiconductor layer 153 formed on the active layer 154, and an n-type electrode 152 disposed to be separated from the p-type electrode 156 in the horizontal direction on the n-type semiconductor layer 153. In this instance, the p-type electrode 156 may be electrically connected to a welding portion by the conductive adhesive layer 130, and the n-type electrode 152 may be electrically connected to the second electrode 140.

Referring to FIGS. 2, 3A and 3B again, the auxiliary electrode 170 may be formed in an elongated manner in one direction to be electrically connected to a plurality of semiconductor light emitting devices 150. For example, the left and right p-type electrodes of the semiconductor light emitting devices around the auxiliary electrode may be electrically connected to one auxiliary electrode.

More specifically, the semiconductor light emitting device 150 is pressed into the conductive adhesive layer 130, and through this, only a portion between the p-type electrode 156 and auxiliary electrode 170 of the semiconductor light emitting device 150 and a portion between the n-type electrode 152 and second electrode 140 of the semiconductor light emitting device 150 have conductivity, and the remaining portion does not have conductivity since there is no push-down of the semiconductor light emitting device. Furthermore, a plurality of semiconductor light emitting devices 150 constitute a light-emitting array, and a phosphor layer 180 is formed on the light-emitting array.

The light emitting device may include a plurality of semiconductor light emitting devices with different self luminance values. Each of the semiconductor light emitting devices 150 constitutes a sub-pixel, and is electrically connected to the first electrode 120. For example, there may exist a plurality of first electrodes 120, and the semiconductor light emitting devices are arranged in several rows, for instance, and each row of the semiconductor light emitting devices may be electrically connected to any one of the plurality of first electrodes.

Furthermore, the semiconductor light emitting devices may be connected in a flip chip form, and thus semiconductor light emitting devices grown on a transparent dielectric substrate. Furthermore, the semiconductor light emitting devices may be nitride semiconductor light emitting devices, for instance. The semiconductor light emitting device 150 has an excellent luminance characteristic, and thus it is possible to configure individual sub-pixels even with a small size thereof.

According to the drawing, a partition wall 190 may be formed between the semiconductor light emitting devices 150. In this instance, the partition wall 190 may perform the role of dividing individual sub-pixels from one another, and be formed as an integral body with the conductive adhesive layer 130. For example, a base member of the anisotropic conductive film may form the partition wall when the semiconductor light emitting device 150 is inserted into the anisotropic conductive film.

Furthermore, when the base member of the anisotropic conductive film is black, the partition wall 190 may have reflective characteristics while at the same time increasing contrast with no additional black insulator. In another example, a reflective partition wall may be separately provided with the partition wall 190. In this instance, the partition wall 190 may include a black or white insulator according to the purpose of the display device. It may have an effect of enhancing reflectivity when the partition wall of the while insulator is used, and increase contrast while at the same time having reflective characteristics.

The phosphor layer 180 may be located at an outer surface of the semiconductor light emitting device 150. For example, the semiconductor light emitting device 150 is a blue semiconductor light emitting device that emits blue (B) light, and the phosphor layer 180 performs the role of converting the blue (B) light into the color of a sub-pixel. The phosphor layer 180 may be a red phosphor layer 181 or green phosphor layer 182 constituting individual pixels.

In other words, a red phosphor 181 capable of converting blue light into red (R) light may be deposited on the blue semiconductor light emitting device 151 at a location implementing a red sub-pixel, and a green phosphor 182 capable of converting blue light into green (G) light may be deposited on the blue semiconductor light emitting device 151 at a location implementing a green sub-pixel. Furthermore, only the blue semiconductor light emitting device 151 may be solely used at a location implementing a blue sub-pixel. In this instance, the red (R), green (G) and blue (B) sub-pixels may implement one pixel. More specifically, one color phosphor may be deposited along each line of the first electrode 120. Accordingly, one line on the first electrode 120 may be an electrode controlling one color. In other words, red (R), green (B) and blue (B) may be sequentially disposed, thereby implementing sub-pixels.

However, the present disclosure is not limited to this, and the semiconductor light emitting device 150 may be combined with a quantum dot (QD) instead of a phosphor to implement sub-pixels such as red (R), green (G) and blue (B). Furthermore, a black matrix 191 may be disposed between each phosphor layer to enhance contrast. In other words, the black matrix 191 can enhance the contrast of luminance. However, the present disclosure is not limited to this, and another structure for implementing blue, red and green may be also applicable thereto.

Figure 5A:
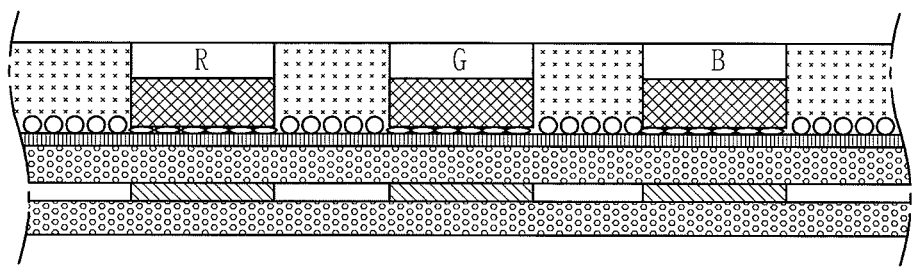
FIGS. 5A to 5C are conceptual views illustrating various forms for implementing colors in connection with a flip-chip type semiconductor light emitting device.

Referring to FIG. 5A, each of the semiconductor light emitting devices 150 may be implemented with a high-power light emitting device that emits various lights including blue in which gallium nitride (GaN) is mostly used, and indium (In) and or aluminum (Al) are added thereto. In this instance, the semiconductor light emitting device 150 may be red, green and blue semiconductor light emitting devices, respectively, to implement each sub-pixel. For instance, red, green and blue semiconductor light emitting devices (R, G, B) are alternately disposed, and red, green and blue sub-pixels implement one pixel by means of the red, green and blue semiconductor light emitting devices, thereby implementing a full color display.

Figure 5B:
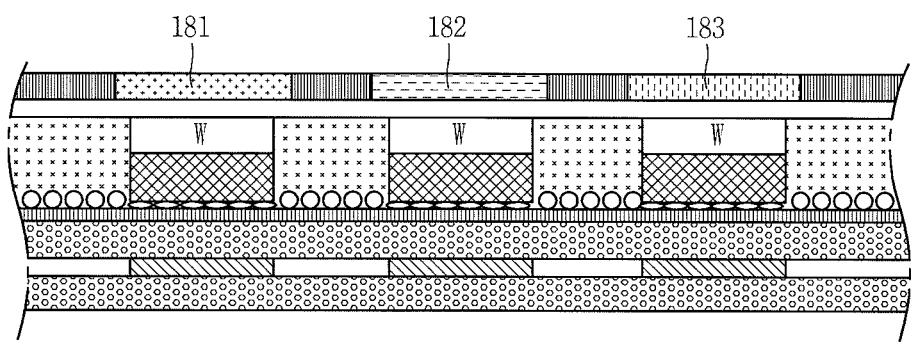

Referring to FIG. 5B, the semiconductor light emitting device may have a white light emitting device (W) provided with a yellow phosphor layer for each element. In this instance, a red phosphor layer 181, a green phosphor layer 182 and blue phosphor layer 183 may be provided on the white light emitting device (W) to implement a sub-pixel. Furthermore, a color filter repeated with red, green and blue on the white light emitting device (W) may be used to implement a sub-pixel.

Figure 5C:
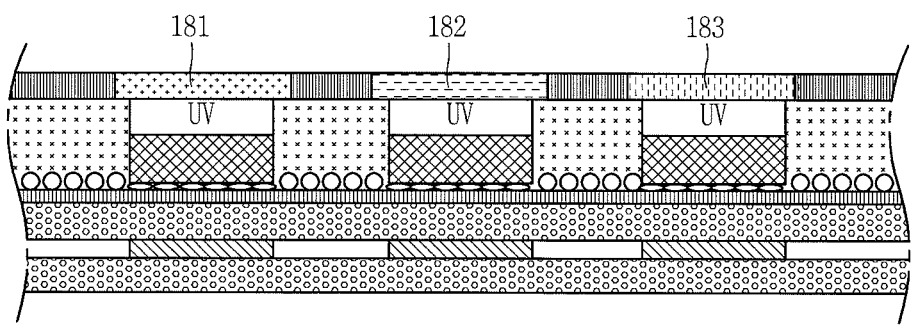

Referring to FIG. 5C, it is possible to also have a structure in which a red phosphor layer 181, a green phosphor layer 182 and blue phosphor layer 183 may be provided on a ultra violet light emitting device (UV). Thus, the semiconductor light emitting device can be used over the entire region up to ultra violet (UV) as well as visible light, and may be extended to a form of semiconductor light emitting device in which ultra violet (UV) can be used as an excitation source.

Taking the present example into consideration again, the semiconductor light emitting device 150 is placed on the conductive adhesive layer 130 to configure a sub-pixel in the display device. The semiconductor light emitting device 150 may have excellent luminance characteristics, and thus it is possible to configure individual sub-pixels even with a small size thereof. The size of the individual semiconductor light emitting device 150 may be less than 80 μm in the length of one side thereof, and formed with a rectangular or square shaped element. In case of a rectangular shaped element, the size thereof may be less than 20×80 μm.

Furthermore, even when a square shaped semiconductor light emitting device 150 with a length of side of 10 μm is used for a sub-pixel, it will exhibit a sufficient brightness for implementing a display device. Accordingly, for example, for a rectangular pixel in which one side of a sub-pixel is 600 μm in size, and the remaining one side thereof is 300 μm, a relative distance between the semiconductor light emitting devices becomes sufficiently large. Accordingly, in this instance, it is possible to implement a flexible display device having a HD image quality.

A display device using the foregoing semiconductor light emitting device will be fabricated by a new type of fabrication method. Hereinafter, the fabrication method will be described with reference to FIG. 6. In particular, FIG. 6 is cross-sectional views illustrating a method of fabricating a display device using a semiconductor light emitting device according to the present disclosure.

Figure 6:
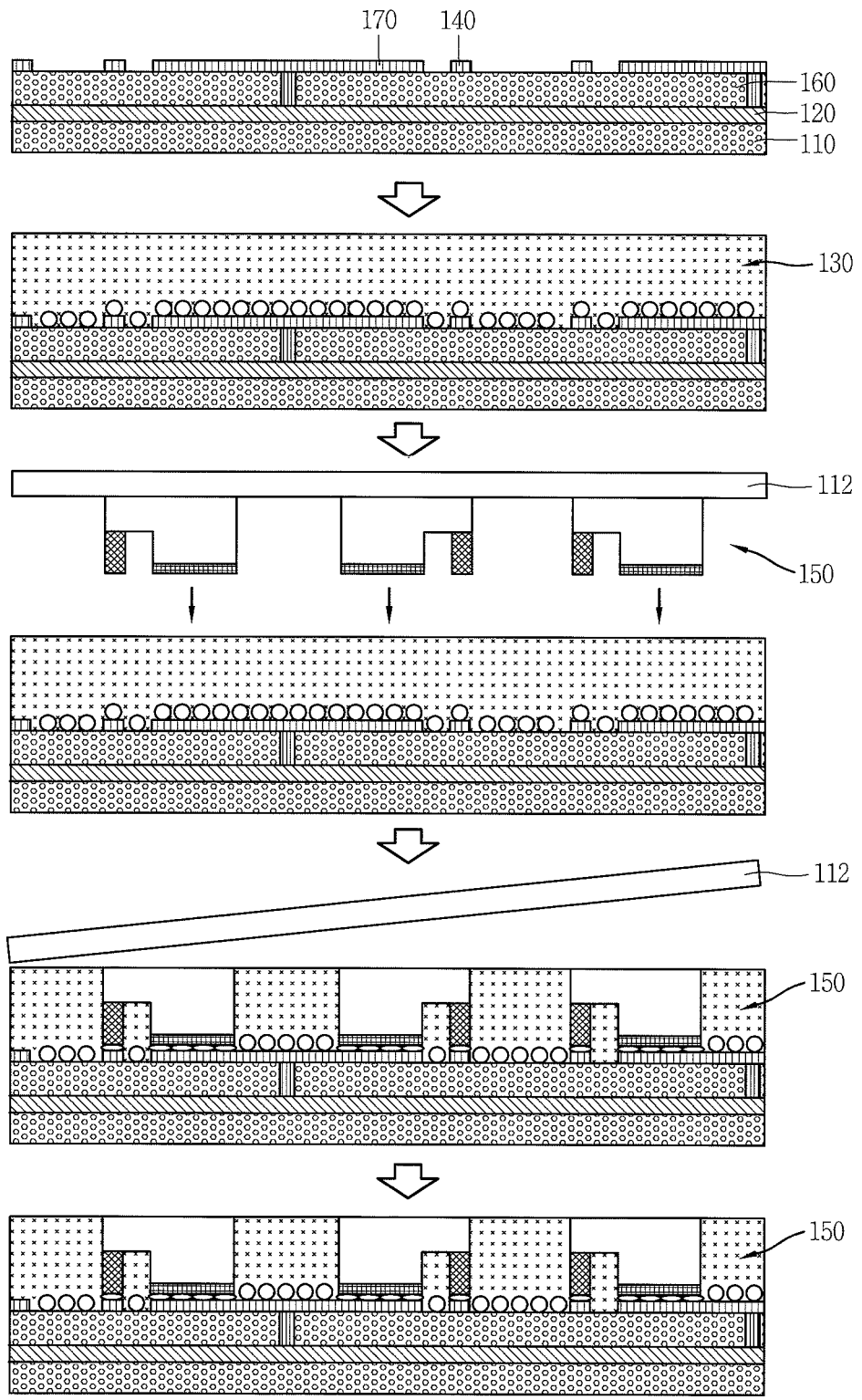
FIG. 6 is cross-sectional views illustrating a fabrication method of a display device using a semiconductor light emitting device according to the present disclosure.

Referring to FIG. 6, first, the conductive adhesive layer 130 is formed on the insulating layer 160 located with the auxiliary electrode 170 and second electrode 140. The insulating layer 160 is deposited on the first substrate 110 to form one substrate (or wiring substrate), and the first electrode 120, auxiliary electrode 170 and second electrode 140 are disposed at the wiring substrate. In this instance, the first electrode 120 and second electrode 140 may be disposed in a perpendicular direction to each other. Furthermore, the first substrate 110 and insulating layer 160 may contain glass or polyimide (PI), respectively, to implement a flexible display device.

The conductive adhesive layer 130 may be implemented by an anisotropic conductive film, for example, and thus, an anisotropic conductive film may be coated on a substrate located with the insulating layer 160. Next, a second substrate 112 located with a plurality of semiconductor light emitting devices 150 corresponding to the location of the auxiliary electrodes 170 and second electrodes 140 and constituting individual pixels is disposed such that the semiconductor light emitting device 150 faces the auxiliary electrode 170 and second electrode 140.

In this instance, the second substrate 112 as a growth substrate for growing the semiconductor light emitting device 150 may be a sapphire substrate or silicon substrate. The semiconductor light emitting device may have a gap and size capable of implementing a display device when formed in the unit of wafer, and thus effectively used for a display device.

Next, the wiring substrate is thermally compressed to the second substrate 112. For example, the wiring substrate and second substrate 112 may be thermally compressed to each other by applying an ACF press head. The wiring substrate and second substrate 112 are bonded to each other using the thermal compression. Only a portion between the semiconductor light emitting device 150 and the auxiliary electrode 170 and second electrode 140 may have conductivity due to the characteristics of an anisotropic conductive film having conductivity by thermal compression, thereby allowing the electrodes and semiconductor light emitting device 150 to be electrically connected to each other. At this time, the semiconductor light emitting device 150 may be inserted into the anisotropic conductive film, thereby forming a partition wall between the semiconductor light emitting devices 150.

Next, the second substrate 112 is removed. For example, the second substrate 112 may be removed using a laser lift-off (LLO) or chemical lift-off (CLO) method. Finally, the second substrate 112 is removed to expose the semiconductor light emitting devices 150 to the outside. Silicon oxide (SiOx) or the like may be coated on the wiring substrate coupled to the semiconductor light emitting device 150 to form a transparent insulating layer.

Furthermore, it may further include the process of forming a phosphor layer on one surface of the semiconductor light emitting device 150. For example, the semiconductor light emitting device 150 may be a blue semiconductor light emitting device for emitting blue (B) light, and red or green phosphor for converting the blue (B) light into the color of the sub-pixel may form a layer on one surface of the blue semiconductor light emitting device.

The fabrication method or structure of a display device using the foregoing semiconductor light emitting device may be modified in various forms. For example, the foregoing display device may be applicable to a vertical semiconductor light emitting device. Hereinafter, the vertical structure will be described with reference to FIGS. 5 and 6.

Figure 7:
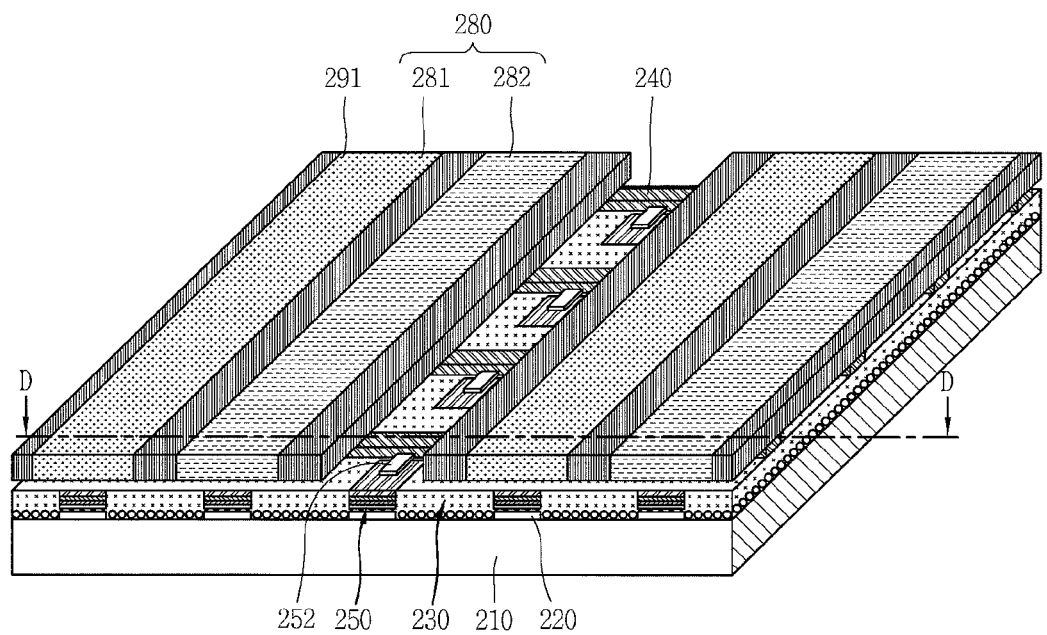
FIG. 7 is a perspective view illustrating a display device using a semiconductor light emitting device according to another embodiment of the present disclosure.
Figure 8:
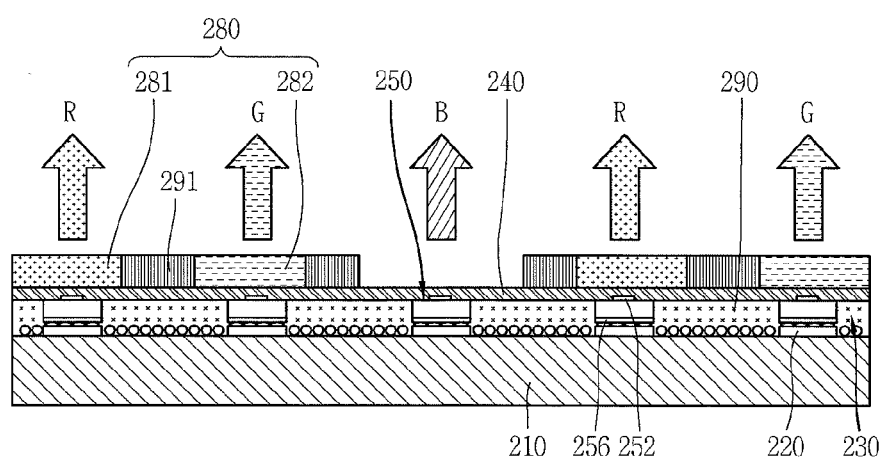
FIG. 8 is a cross-sectional view taken along line D-D in FIG. 7.
Figure 9:
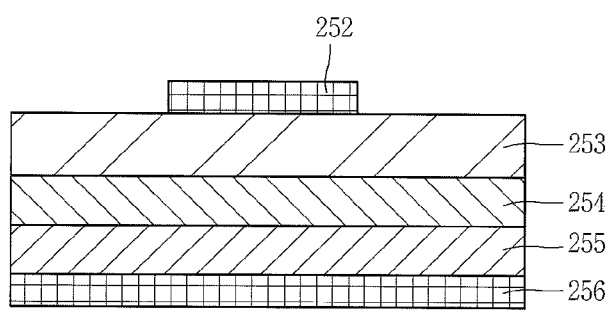
FIG. 9 is a conceptual view illustrating a vertical type semiconductor light emitting device in FIG. 8.

Furthermore, according to the following modified example or embodiment, the same or similar reference numerals are designated to the same or similar configurations to the foregoing example, and the description thereof will be substituted by the earlier description. In particular, FIG. 7 is a perspective view illustrating a display device using a semiconductor light emitting device according to another embodiment of the present disclosure. FIG. 8 is a cross-sectional view taken along line C-C in FIG. 7, and FIG. 9 is a conceptual view illustrating a vertical type semiconductor light emitting device in FIG. 8.

According to the drawings, the display device may be display device using a passive matrix (PM) type of vertical semiconductor light emitting device. The display device may include a substrate 210, a first electrode 220, a conductive adhesive layer 230, a second electrode 240 and a plurality of semiconductor light emitting devices 250. The substrate 210 as a wiring substrate disposed with the first electrode 220 may include polyimide (PI) to implement a flexible display device. In addition, any one may be used if it is an insulating and flexible material.

The first electrode 220 may be located on the substrate 210, and formed with an electrode having a bar elongated in one direction. The first electrode 220 may be formed to perform the role of a data electrode. The conductive adhesive layer 230 is formed on the substrate 210 located with the first electrode 220. Similarly to a display device to which a flip chip type light emitting device is applied, the conductive adhesive layer 230 may be an anisotropic conductive film (ACF), an anisotropic conductive paste, a solution containing conductive particles, and the like. However, the present embodiment illustrates a case where the conductive adhesive layer 230 is implemented by an anisotropic conductive film.

When an anisotropic conductive film is located when the first electrode 220 is located on the substrate 210, and then heat and pressure are applied to connect the semiconductor light emitting device 250 thereto, the semiconductor light emitting device 250 is electrically connected to the first electrode 220. At this time, the semiconductor light emitting device 250 may be preferably disposed on the first electrode 220.

The electrical connection is generated because an anisotropic conductive film partially has conductivity in the thickness direction when heat and pressure are applied as described above. Accordingly, the anisotropic conductive film is partitioned into a portion 231 having conductivity and a portion 232 having no conductivity in the thickness direction thereof. Furthermore, the anisotropic conductive film contains an adhesive component, and thus the conductive adhesive layer 230 implements a mechanical coupling as well as an electrical coupling between the semiconductor light emitting device 250 and the first electrode 220.

Thus, the semiconductor light emitting device 250 is placed on the conductive adhesive layer 230, thereby configuring a separate sub-pixel in the display device. The semiconductor light emitting device 250 may have excellent luminance characteristics, and thus it is possible to configure individual sub-pixels even with a small size thereof. The size of the individual semiconductor light emitting device 250 may be less than 80 μm in the length of one side thereof, and formed with a rectangular or square shaped element. In case of a rectangular shaped element, the size thereof may be less than 20×80 μm.

The semiconductor light emitting device 250 may be a vertical structure. A plurality of second electrodes 240 disposed in a direction crossed with the length direction of the first electrode 220, and electrically connected to the vertical semiconductor light emitting device 250 may be located between vertical semiconductor light emitting devices.

Referring to FIG. 9, the vertical semiconductor light emitting device may include a p-type electrode 256, a p-type semiconductor layer 255 formed with the p-type electrode 256, an active layer 254 formed on the p-type semiconductor layer 255, an n-type semiconductor layer 253 formed on the active layer 254, and an n-type electrode 252 formed on the n-type semiconductor layer 253. In this instance, the p-type electrode 256 located at the bottom thereof may be electrically connected to the first electrode 220 by the conductive adhesive layer 230, and the n-type electrode 252 located at the top thereof may be electrically connected to the second electrode 240 which will be described later. The electrodes may be disposed in the upward/downward direction in the vertical semiconductor light emitting device 250, thereby providing a great advantage capable of reducing the chip size.

Referring to FIG. 8 again, a phosphor layer 280 may be formed on one surface of the semiconductor light emitting device 250. For example, the semiconductor light emitting device 250 is a blue semiconductor light emitting device 251 that emits blue (B) light, and the phosphor layer 280 for converting the blue (B) light into the color of the sub-pixel may be provided thereon. In this instance, the phosphor layer 280 may be a red phosphor 281 and a green phosphor 282 constituting individual pixels.

In other words, a red phosphor 281 capable of converting blue light into red (R) light may be deposited on the blue semiconductor light emitting device 251 at a location implementing a red sub-pixel, and a green phosphor 282 capable of converting blue light into green (G) light may be deposited on the blue semiconductor light emitting device 251 at a location implementing a green sub-pixel. Furthermore, only the blue semiconductor light emitting device 251 may be solely used at a location implementing a blue sub-pixel.

In this instance, the red (R), green (G) and blue (B) subpixels may implement one pixel.

However, the present disclosure is not limited to this, and another structure for implementing blue, red and green may be also applicable thereto as described above in a display device to which a flip chip type light emitting device is applied. Taking the present embodiment into consideration again, the second electrode 240 is located between the semiconductor light emitting devices 250, and electrically connected to the semiconductor light emitting devices 250. For example, the semiconductor light emitting devices 250 may be disposed in a plurality of rows, and the second electrode 240 may be located between the rows of the semiconductor light emitting devices 250.

Since a distance between the semiconductor light emitting devices 250 constituting individual pixels is sufficiently large, the second electrode 240 may be located between the semiconductor light emitting devices 250. The second electrode 240 may be formed with an electrode having a bar elongated in one direction, and disposed in a perpendicular direction to the first electrode.

Furthermore, the second electrode 240 may be electrically connected to the semiconductor light emitting device 250 by a connecting electrode protruded from the second electrode 240. More specifically, the connecting electrode may be an n-type electrode of the semiconductor light emitting device 250. For example, the n-type electrode is formed with an ohmic electrode for ohmic contact, and the second electrode covers at least part of the ohmic electrode by printing or deposition. Through this, the second electrode 240 may be electrically connected to the n-type electrode of the semiconductor light emitting device 250.

According to the drawing, the second electrode 240 may be located on the conductive adhesive layer 230. According to circumstances, a transparent insulating layer containing silicon oxide (SiOx) may be formed on the substrate 210 formed with the semiconductor light emitting device 250. When the transparent insulating layer is formed and then the second electrode 240 is placed thereon, the second electrode 240 may be located on the transparent insulating layer. Furthermore, the second electrode 240 may be formed to be separated from the conductive adhesive layer 230 or transparent insulating layer.

If a transparent electrode such as indium tin oxide (ITO) is used to locate the second electrode 240 on the semiconductor light emitting device 250, the ITO material has a problem of bad adhesiveness with an n-type semiconductor. Accordingly, the second electrode 240 may be placed between the semiconductor light emitting devices 250, thereby obtaining an advantage in which the transparent electrode is not required. Accordingly, an n-type semiconductor layer and a conductive material having a good adhesiveness may be used as a horizontal electrode without being restricted by the selection of a transparent material, thereby enhancing the light extraction efficiency.

According to the drawing, a partition wall 290 may be formed between the semiconductor light emitting devices 250. In other words, the partition wall 290 may be disposed between the vertical semiconductor light emitting devices 250 to isolate the semiconductor light emitting device 250 constituting individual pixels. In this instance, the partition wall 290 may perform the role of dividing individual subpixels from one another, and be formed as an integral body with the conductive adhesive layer 230. For example, a base member of the anisotropic conductive film may form the partition wall when the semiconductor light emitting device 250 is inserted into the anisotropic conductive film.

Furthermore, when the base member of the anisotropic conductive film is black, the partition wall 290 may have reflective characteristics while at the same time increasing contrast with no additional black insulator. In another example, a reflective partition wall may be separately provided with the partition wall 290. In this instance, the partition wall 290 may include a black or white insulator according to the purpose of the display device.

If the second electrode 240 is precisely located on the conductive adhesive layer 230 between the semiconductor light emitting devices 250, the partition wall 290 may be located between the semiconductor light emitting device 250 and second electrode 240. Accordingly, individual sub-pixels may be configured even with a small size using the semiconductor light emitting device 250, and a distance between the semiconductor light emitting devices 250 may be relatively sufficiently large to place the second electrode 240 between the semiconductor light emitting devices 250, thereby having the effect of implementing a flexible display device having a HD image quality.

Furthermore, according to the drawing, a black matrix 291 may be disposed between each phosphor layer to enhance contrast. In other words, the black matrix 191 can enhance the contrast of luminance. As described above, the semiconductor light emitting device 250 is located on the conductive adhesive layer 230, thereby constituting individual pixels on the display device. Since the semiconductor light emitting device 250 has excellent luminance characteristics, thereby configuring individual sub-pixels even with a small size thereof. As a result, it is possible to implement a full color display in which the sub-pixels of red (R), green (G) and blue (B) implement one pixel by means of the semiconductor light emitting device.

According to a display device using a semiconductor light emitting device according to the present disclosure as described above, it may be difficult to implement fine pitch since a first and a second electrode are arranged on the same plane when a flip chip type is applied thereto. Hereinafter, a display device to which a flip chip type semiconductor light emitting device according to another embodiment of the present disclosure capable of solving this problem is applied will be described in more detail.

Figure 10:
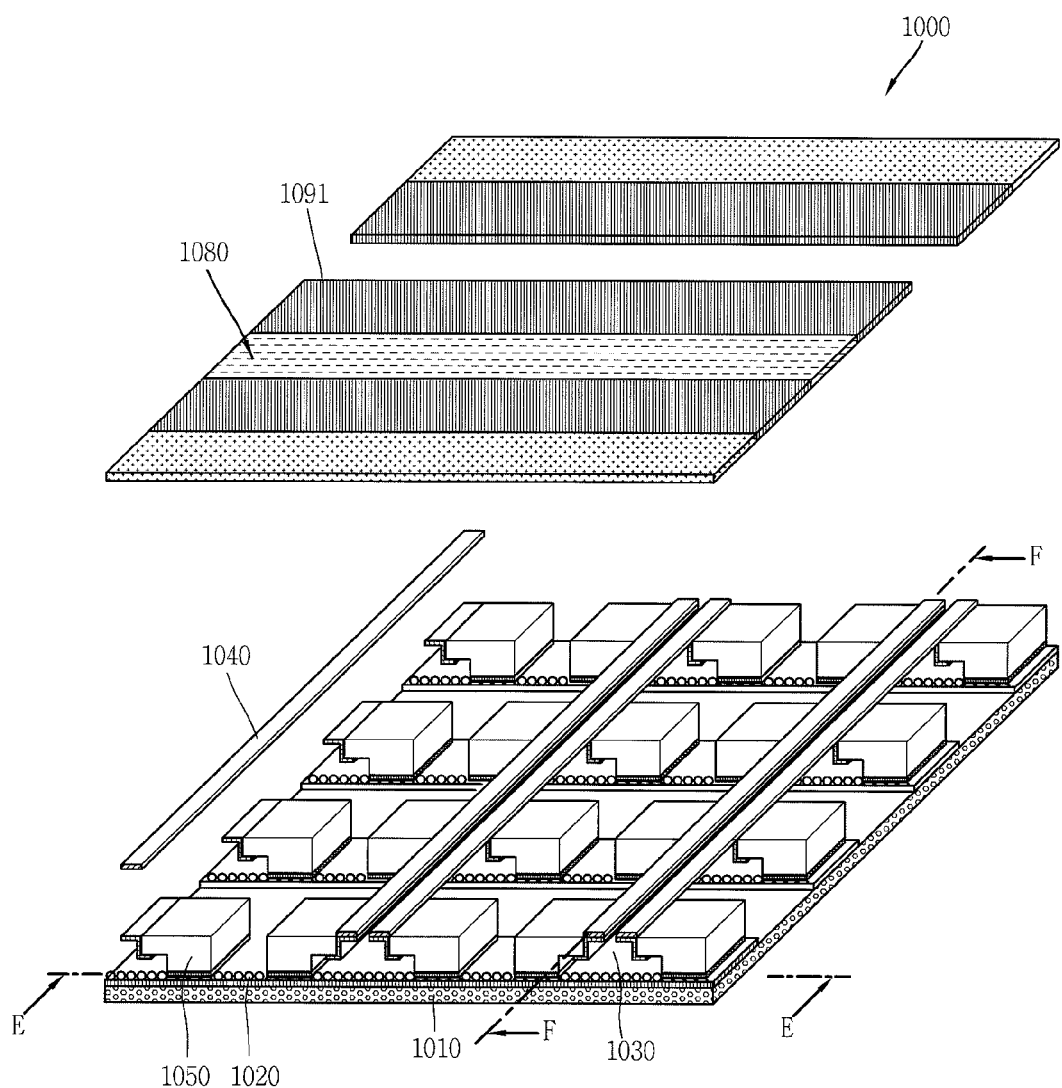
FIG. 10 is an enlarged view illustrating portion "A" in FIG. 1 illustrating another embodiment of the present disclosure to which a new type semiconductor light emitting device is applied.
Figure 11A:
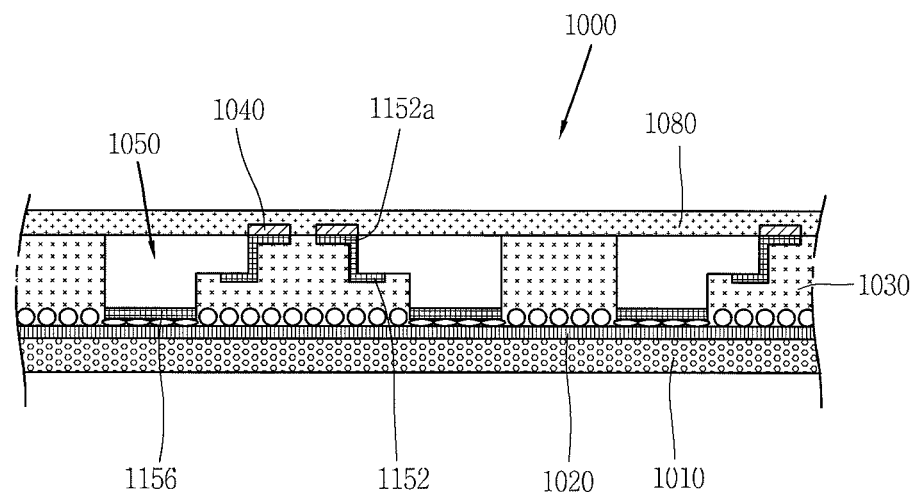
FIG. 11A is a cross-sectional view taken along line E-E in FIG. 10.
Figure 11B:
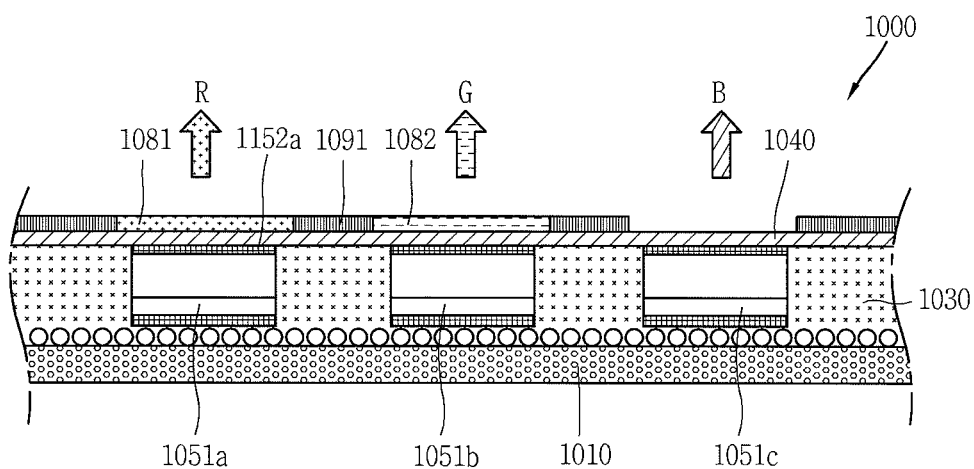
FIG. 11B is a cross-sectional view taken along line F-F in FIG. 10.
Figure 12:
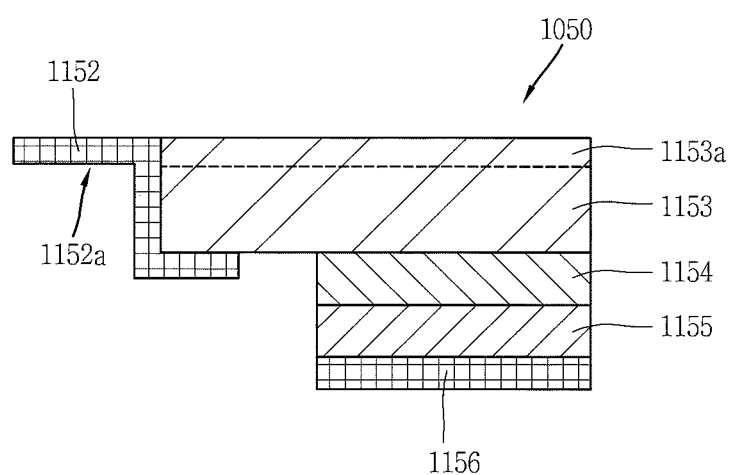
FIG. 12 is a conceptual view illustrating a flip chip type semiconductor light emitting device in FIG. 11A.

FIG. 10 is an enlarged view illustrating portion "A" in FIG. 1 illustrating another embodiment of the present disclosure to which a new type semiconductor light emitting device is applied, and FIG. 11A is a cross-sectional view taken along line E-E in FIG. 10, and FIG. 11B is a cross-sectional view taken along line F-F in FIG. 10, and FIG. 12 is a conceptual view illustrating a flip chip type semiconductor light emitting device in FIG. 11A.

Referring to FIGS. 10, 11A and 11B, there is illustrated a display device 100 using a passive matrix (PM) type semiconductor light emitting device as a display device 1000 using a semiconductor light emitting device. However, the following illustration may be also applicable to an active matrix (AM) type semiconductor light emitting device. The display device 1000 may include a substrate 1010, a first electrode 1020, a conductive adhesive layer 1030, a second electrode 1040, and a plurality of semiconductor light emitting devices 1050. Here, the first electrode 1020 and second electrode 1040 may include a plurality of electrode lines, respectively.

The substrate 1010 as a wiring substrate on which the first electrode 1020 is disposed may include polyimide (PI) to implement a flexible display device. In addition, any one may be used if it is an insulating and flexible material. The first electrode 1020 may be located on the substrate 1010, and formed with an electrode having a bar elongated in one direction. The first electrode 1020 may be formed to perform the role of a data electrode.

The conductive adhesive layer 1030 is formed on the substrate 1010 located with the first electrode 1020. Similarly to a display device to which a flip chip type light emitting device is applied, the conductive adhesive layer 1030 may be an anisotropic conductive film (ACF), an anisotropic conductive paste, a solution containing conductive particles, and the like. However, the conductive adhesive layer 1030 may be replaced with an adhesive layer. For example, if the first electrode 1020 is formed integrally with a conductive electrode of the semiconductor light emitting device without being located on the substrate 1010, then the adhesive layer may not be required.

A plurality of second electrodes 1040 disposed in a direction crossed with the length direction of the first electrode 1020, and electrically connected to the semiconductor light emitting device 1050 may be located between the semiconductor light emitting devices. According to the drawing, the second electrode 1040 may be located on the conductive adhesive layer 1030. In other words, the conductive adhesive layer 1030 is disposed between the wiring substrate and the second electrode 1040. The second electrode 1040 may be electrically connected thereto due to a contact with the semiconductor light emitting device 1050.

Due to the foregoing structure, the plurality of semiconductor light emitting devices 1050 are coupled to the conductive adhesive layer 1030, and electrically connected to the first electrode 1020 and second electrode 1040. According to circumstances, a transparent insulating layer containing silicon oxide (SiOx) may be formed on the substrate 1010 formed with the semiconductor light emitting device 1050. When the transparent insulating layer is formed and then the second electrode 1040 is placed thereon, the second electrode 1040 may be located on the transparent insulating layer. Furthermore, the second electrode 1040 may be formed to be separated from the conductive adhesive layer 1030 or transparent insulating layer.

As illustrated in the drawing, the plurality of semiconductor light emitting devices 1050 may form a plurality of columns in a direction in parallel to a plurality of electrode lines provided in the first electrode 1020. However, the present disclosure is not limited to this. For example, the plurality of semiconductor light emitting devices 1050 may form a plurality of columns along the second electrode 1040.

Moreover, the display device 1000 may further include a phosphor layer 1080 formed on one surface of the plurality of semiconductor light emitting devices 1050. For example, the semiconductor light emitting device 1050 is a blue semiconductor light emitting device that emits blue (B) light, and the phosphor layer 1080 performs the role of converting the blue (B) light into the color of a sub-pixel. The phosphor layer 1080 may be a red phosphor layer 1081 or green phosphor layer 1082 constituting individual pixels. In other words, a red phosphor 1081 capable of converting blue light into red (R) light may be deposited on the blue semiconductor light emitting device 1051a at a location implementing a red sub-pixel, and a green phosphor 1082 capable of converting blue light into green (G) light may be deposited on the blue semiconductor light emitting device 1051b at a location implementing a green sub-pixel.

Furthermore, only the blue semiconductor light emitting device 1051c may be solely used at a location implementing a blue sub-pixel. In this instance, the red (R), green (G) and blue (B) sub-pixels may implement one pixel. More specifically, one color phosphor may be deposited along each line of the first electrode 1020. Accordingly, one line on the first electrode 1020 may be an electrode controlling one color. In other words, red (R), green (B) and blue (B) may be sequentially disposed along the second electrode 1040, thereby implementing sub-pixels. However, the present disclosure is not limited to this, and the semiconductor light emitting device 1050 may be combined with a quantum dot (QD) instead of a phosphor to implement sub-pixels such as red (R), green (G) and blue (B).

Further, the display device may further include a black matrix 1091 disposed between each phosphor to enhance the contrast of the phosphor layer 1080. The black matrix 1091 may be formed so a gap is made between phosphor dots, and a black material fills into the gap. Through this, the black matrix 1091 may enhance the contrast between light and shade while at the same time absorbing external light reflection. The black matrix 1091 is located between each phosphor along the first electrode 1020 in a direction on which the phosphor layer 1080 is deposited. In this instance, a phosphor layer is not formed at a location corresponding to the blue semiconductor light emitting device 1051, but black matrices may be formed at both sides by interposing a space with no the phosphor layer therebetween (or interposing the blue semiconductor light emitting device 1051c therebetween).

Referring to the semiconductor light emitting device 1050 according to the present disclosure again, for the semiconductor light emitting device 1050 in the present illustration, electrodes are disposed at the top/bottom, thereby having an advantage of reducing the chip size. However, the electrodes are disposed at both the top/bottom, but a semiconductor light emitting device according to the present disclosure may be a flip chip type light emitting device.

Referring to FIG. 12, for example, the semiconductor light emitting device 1050 may include a first conductive electrode 1156, a first conductive semiconductor layer 1155 formed with the first conductive electrode 1156, an active layer 1154 formed on the first conductive semiconductor layer 1155, and a second conductive semiconductor layer 1153 formed on the active layer 1154 and a second conductive electrode 1152 formed on the second conductive semiconductor layer 1153.

More specifically, the first conductive electrode 1156 and first conductive semiconductor layer 1155 may be a p-type electrode and a p-type semiconductor layer, respectively, and the second conductive electrode 1152 and second conductive semiconductor layer 1153 may be an n-type electrode and a n-type semiconductor layer, respectively. However, the present disclosure is not limited to this, and may also have an illustration in which the first conductive type is an n-type and the second conductive type is a p-type.

More specifically, the first conductive electrode 1156 is formed on one surface of the first conductive semiconductor layer 1155, and the active layer 1154 is formed between the other surface of the first conductive semiconductor layer 1155 and one surface of the second conductive semiconductor layer 1153, and the second conductive electrode 1152 is formed on one surface of the second conductive semiconductor layer 1153.

In this instance, the second conductive electrode may be disposed on one surface of the second conductive semiconductor layer 1153, and an undoped semiconductor layer 1153a may be formed on the other surface of the second conductive semiconductor layer 1153.

Referring to FIG. 12 along with FIGS. 10 through 11B, one surface of the second conductive semiconductor layer may be a surface which is the closest to the wiring substrate, and the other surface of the second conductive semiconductor layer may be a surface which is the farthest surface from the wiring substrate. Furthermore, the first conductive electrode 1156 and second conductive electrode 1152 are formed to have a height difference in the width direction and vertical direction (or thickness direction) at a separated position along the width direction of the semiconductor light emitting device.

The second conductive electrode 1152 is formed on the second conductive semiconductor layer 1153 using the height difference, but disposed adjacent to the second electrode 1040 located at an upper side of the semiconductor light emitting device. For example, at least part of the second conductive electrode 1152 may be protruded along the width direction from a lateral surface of the second conductive semiconductor layer 1153 (or lateral surface of the undoped semiconductor layer 1153*a*). Thus, since the second conductive electrode 1152 is protruded from the lateral surface, the second conductive electrode 1152 may be exposed to an upper side of the semiconductor light emitting device. Through this, the second conductive electrode 1152 is disposed at a position overlapping with the second electrode 1040 disposed at an upper side of the conductive adhesive layer 1030.

More specifically, the semiconductor light emitting device may include a protrusion portion 1152*a* extended from the second conductive electrode 1152, and protruded from a lateral surface of the plurality of semiconductor light emitting devices. In this instance, based on the protrusion portion 1152*a*, it may be expressed that the first conductive electrode 1156 and second conductive electrode 1152 are disposed at a separated position along the protrusion direction of the protrusion portion 1152*a*, and formed to have a height difference from each other in a direction perpendicular to the protrusion direction.

The protrusion portion 1152*a* is extended from one surface of the second conductive semiconductor layer 1153 to a lateral surface thereof, and extended to an upper surface of the second conductive semiconductor layer 1153, more particularly, the undoped semiconductor layer 1153*a*. The protrusion portion 1152*a* is protruded along the width direction from a lateral surface of the undoped semiconductor layer 1153*a*. Accordingly, the protrusion portion 1152*a* may be electrically connected to the second electrode 1040 at an opposite side to the first conductive electrode based on the second semiconductor layer.

The structure having the protrusion portion 1152*a* may be a structure in which advantages of the foregoing horizontal semiconductor light emitting device and vertical semiconductor light emitting device can be used. Meanwhile, fine grooves may be formed by roughing on an upper surface which is the farthest from the first conductive electrode 1156 on the undoped semiconductor layer 1153*a*.

According to the foregoing display device, light emitted from semiconductor light emitting devices is excited using phosphors to implement red (R) and green (G). Furthermore, the foregoing black matrices (191, 291, 1091, refer to FIGS. 8 and 11B) may perform the role of a partition wall for preventing color mixture between phosphors. As a result, according to the present disclosure, there is presented a structure of phosphor layer capable of increasing a filling space of phosphor or a new type of partition wall structure having flexibility different from the related art.

Figure 13:
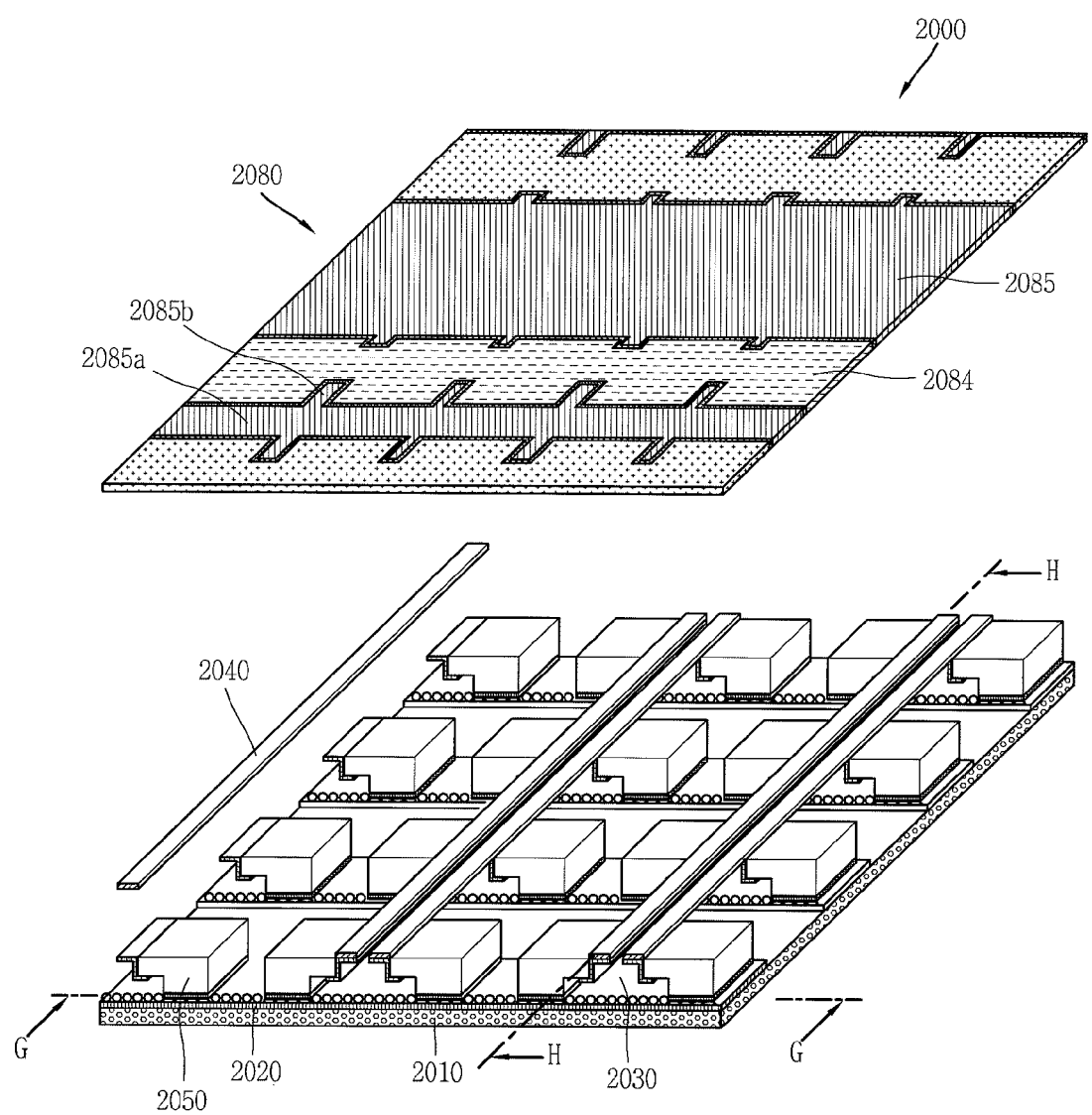
FIG. 13 is an enlarged view illustrating portion "A" illustrating another embodiment of the present disclosure.
Figure 14:
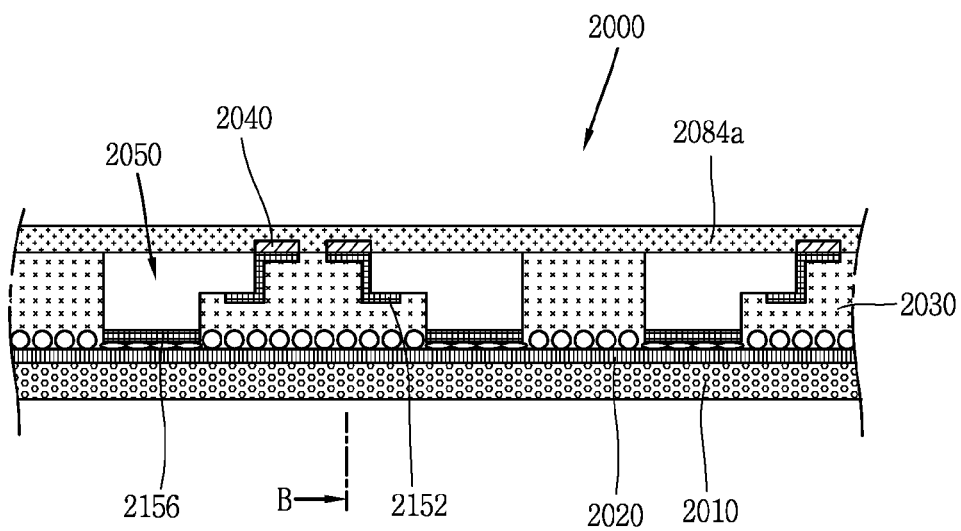
FIG. 14 is a cross-sectional view taken along line G-G in FIG. 13.
Figure 15:
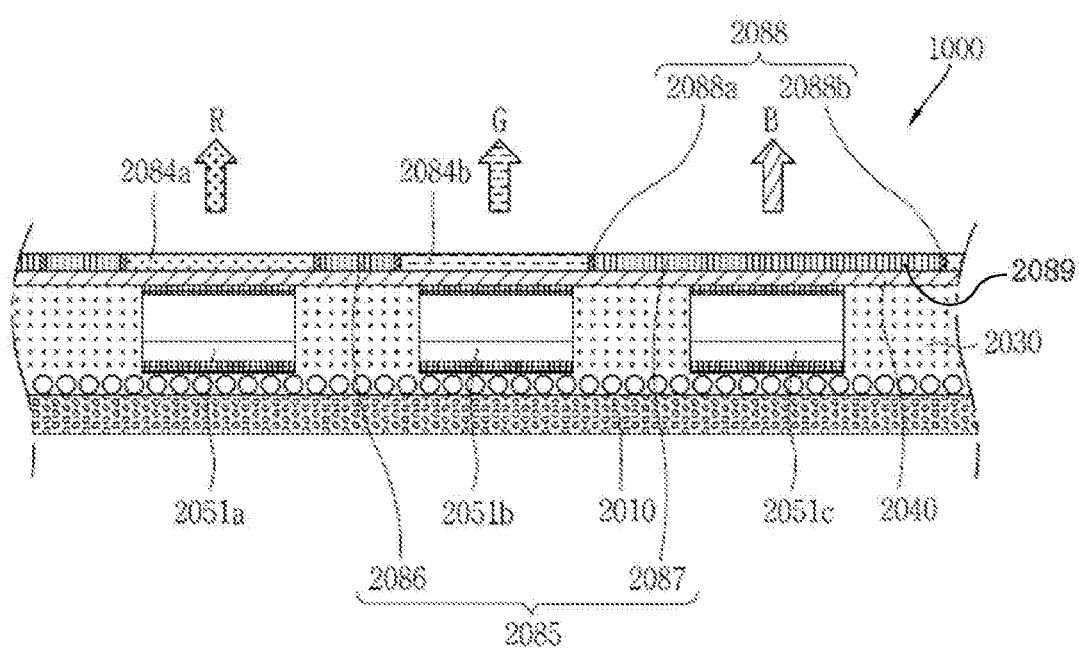
FIG. 15 is a cross-sectional view taken along line H-H in FIG. 13.
Figure 16A:
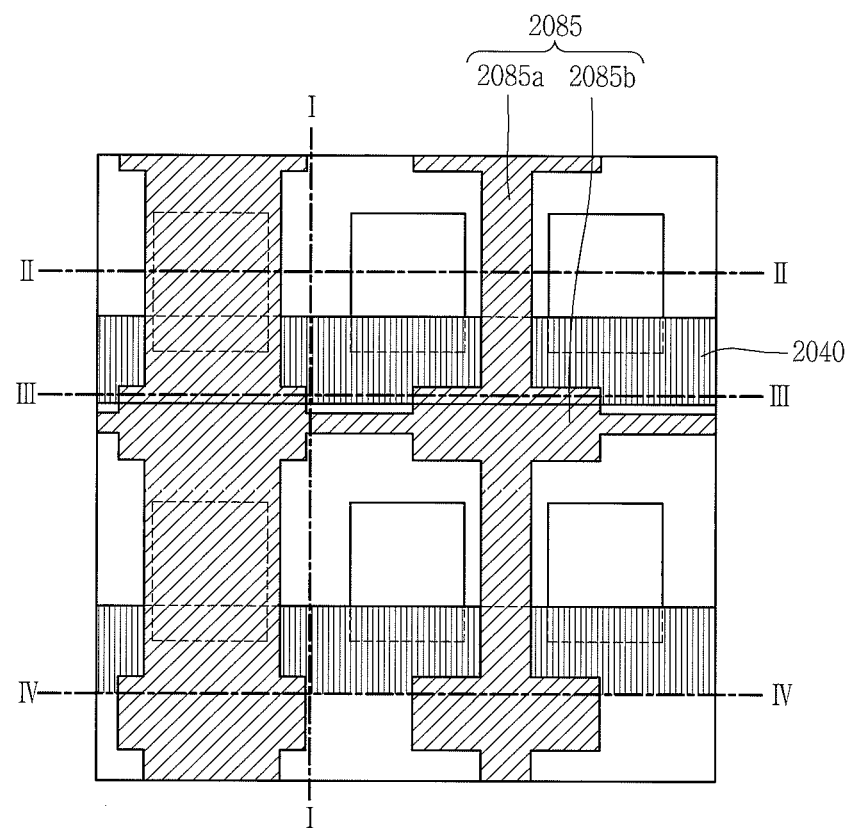
FIG. 16A is a plan view of FIG. 13, and FIGS. 16B to 16E are cross-sectional views taken along lines I-I, II-II, III-III and IV-IV, respectively, in FIG. 16A.
Figure 16B:
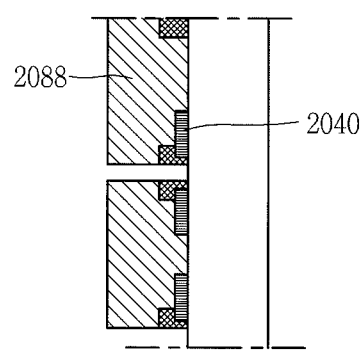
Figure 16C:
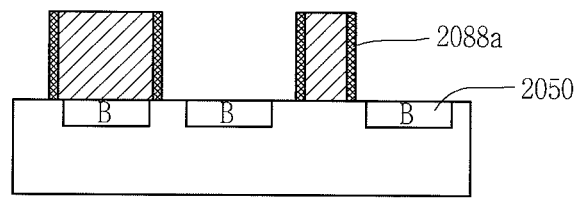
Figure 16D:
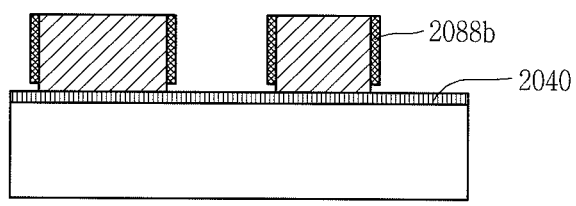
Figure 16E:
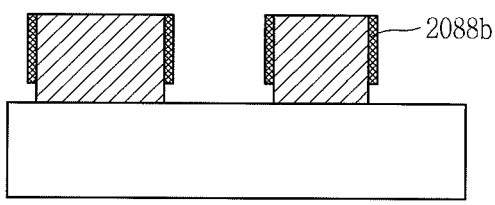

Hereinafter, the structure of a display device according to the present disclosure will be described in detail with reference to the accompanying drawings. FIG. 13 is an enlarged view illustrating portion "A" illustrating another embodiment of the present disclosure, and FIG. 14 is a cross-sectional view taken along line G-G in FIG. 13, and FIG. 15 is a cross-sectional view taken along line H-H in FIG. 13, and FIG. 16A is a plan view of FIG. 13, and FIGS. 16B, 16C, 16D and 16E are cross-sectional views taken along lines I-I, II-II, and IV-IV, respectively, in FIG. 16A.

According to the illustrations of FIGS. 13, 14, 15 and 16A, as a display device using the semiconductor light emitting device, there is illustrated a display device 2000 using a flip chip type semiconductor light emitting device described with reference to FIGS. 10 through 12. More specifically, there is illustrated a new structure of phosphor layer is applied to a flip chip type semiconductor light emitting device described with reference to FIGS. 10 through 12. However, an example which will be described below may be also applicable to a display device using the foregoing different type of semiconductor light emitting device.

According to the present example which will be described below, the same or similar reference numerals are designated to the same or similar configurations to each configuration of the foregoing example described with reference to FIGS. 10 through 12, and the description thereof will be substituted by the earlier description. For example, the display device 2000 may include a substrate 2010, a first electrode 2020, a conductive adhesive layer 2030, a second electrode 2040 and a plurality of semiconductor light emitting devices 2050, and the description thereof will substituted by the description with reference to FIGS. 10 through 12. Accordingly, the conductive adhesive layer 2030 according to the present embodiment may be replaced with an adhesive layer, and adhered to an adhesive layer in which a plurality of semiconductor light emitting devices are disposed on the substrate 2010, and the first electrode 2020 may be integrally formed with a conductive electrode of the semiconductor light emitting device without being located on the substrate 2010.

The second electrode 2040 may be located on the conductive adhesive layer 2030. In other words, the conductive adhesive layer 2030 is disposed between the wiring substrate and the second electrode 2040. The second electrode 2040 may be electrically connected to the plurality of semiconductor light emitting devices 2050 by contact therewith.

As described above, the display device 2000 may include a phosphor layer 2080 disposed to cover the plurality of semiconductor light emitting devices 2050. For example, the plurality of semiconductor light emitting devices 2050 is a blue semiconductor light emitting device for emitting blue (B) light, and the phosphor layer 2080 performs a function of converting the blue (B) light into a sub-pixel color. According to the drawing, the phosphor layer 2080 may include a plurality of phosphor portions 2084 for converting the wavelength of light and a plurality of partition wall portions 2085 formed between the plurality of phosphor portions 2084.

The plurality of phosphor portions 2084 may include a red phosphor portion 2084*a* having a red phosphor and a green phosphor portion 2084*b* having a green phosphor. At a position forming a red pixel, the red phosphor portion 2084*a* capable of converting blue light into red (R) light may be deposited on a blue semiconductor light emitting device 2051*a*. At a position forming a green pixel, the green phosphor portion 2084*b* capable of converting blue light into green (G) light may be deposited on a blue semiconductor light emitting device 2051*b*.

Further, one partition wall portion 2085 is disposed between the red phosphor portion 2084*a* and the green phosphor portion 2084b. In this instance, at least one of the plurality of partition wall portions 2085 overlaps with at least one of the plurality of semiconductor light emitting devices along a thickness direction of the phosphor layer 2080. Furthermore, at least one of the plurality of partition wall portions 2085 is formed to transmit light along a thickness direction of the phosphor layer 2080. More specifically, one partition wall portion 2085 is disposed on a blue semiconductor light emitting device 2051c at a portion constituting a blue pixel to transmit light emitted from the blue semiconductor light emitting device 2051c to an outside without color conversion.

In this instance, a phosphor portion or partition wall portion may be formed along each line of the first electrode 2020. Accordingly, one line on the first electrode 2020 may be an electrode controlling one color. Furthermore, red (R), green (G) and blue (B) may be sequentially disposed along the second electrode 2040, thereby implementing a sub-pixel. However, the present disclosure is not limited to this, and quantum dot (QD) instead of phosphor may be filled in the phosphor portion to implement a sub-pixel emitting red (R), green (G) and blue (B). For a more specific example, the plurality of partition wall portions 2085 may include a first partition wall portion 2086 and a second partition wall portion 2087.

The first partition wall portion 2086 is disposed to cover between the plurality of semiconductor light emitting devices. Accordingly, at least part of the plurality of phosphor portions 2084 is disposed by interposing the first partition wall portion 2086 therebetween. In this instance, the at least part of the plurality of phosphor portions 2084 may include at least one of red phosphor, green phosphor and yellow phosphor. More specifically, the first partition wall portion 2086 is located at a portion where blue pixels are not disposed among spaces repeatedly formed between the red phosphor portion 2084a and the green phosphor portion 2084b. Accordingly, a semiconductor light emitting device is not disposed at a lower portion of the first partition wall portion 2086.

Further, the second partition wall portion 2087 is configured to cover at least one of the plurality of semiconductor light emitting devices. In this instance, at least one of the plurality of semiconductor light emitting devices covered by the second partition wall portion 2087 may include a blue semiconductor light emitting device 2051c. In other words, the second partition wall portion 2087 is located at a portion where blue pixels are disposed among spaces repeatedly formed between the red phosphor portion 2084a and the green phosphor portion 2084b. Accordingly, the blue semiconductor light emitting device 2051c is disposed at a lower portion of the second partition wall portion 2087.

In order to implement the foregoing structure, the first partition wall portion 2086 and the second partition wall portion 2087 may be disposed one by one within a sub-pixel emitting red (R), green (G) and blue (B), respectively. Furthermore, the first partition wall portion 2086 and the second partition wall portion 2087 may be formed to have different sizes of width formed along a direction perpendicular to a thickness direction of the phosphor layer 2080. In this instance, the first partition wall portion 2086 is formed to have the size of width smaller than that of the second partition wall portion 2087. The width of the second partition wall portion 2087 is configured to be larger than or equal to that of the plurality of semiconductor light emitting devices 2050, and thus the width of the first partition wall portion 2086 may be formed to be smaller than that of the plurality of semiconductor light emitting devices 2050.

In this instance, the width of the second partition wall portion 2087 may be a distance (below) from a width (distance between both ends) of the isolated blue semiconductor light emitting device 2051c to an end of the isolated blue semiconductor light emitting device 2051a corresponding to a red pixel and an end of the isolated blue semiconductor light emitting device 2051b corresponding to a green pixel.

For example, the second partition wall portion 2087 may be formed up to a center position between an end of the isolated blue semiconductor light emitting device 2051c and an end portion of the isolated blue semiconductor light emitting device 2051a corresponding to a red pixel. More specifically, the width of the second partition wall portion 2087 may be a size of 70 to 135% of a pitch between pixels. It is because the light emitting region may be insufficiently secured when the second partition wall portion 2087 is too large and light interference may occur between the blue pixel and the red pixel or between the blue pixel and the green pixel when it is too small.

For example, the width of the second partition wall portion 2087 may be configured to be larger than the size of the isolated blue semiconductor light emitting device 2051c by 1 or 2 micrometers. For a more specific example, when the width of the semiconductor light emitting device is 20 to 22 micrometers, and the pitch thereof is 28 to 30 micrometers, the width of the second partition wall portion 2087 may be 20 to 40 micrometers.

Furthermore, in this instance, the width of the first partition wall portion 2086 may be a size of 10 to 40% of a pitch between pixels. For example, when the pitch is 30 micrometers, the width of the first partition wall portion 2086 may be formed to be less than 10 micrometers. It is to sufficiently secure the light emitting area.

According to the drawing, the width of the phosphor portion 2084 may be configured to be larger than that of the light emitting device 2050. In addition to this, only two partition wall portions exist within a sub-pixel, and the width of one (for example, first partition wall portion) of the two becomes smaller, and thus the width of the phosphor portion 2084 further increases. Thus, since the width of the phosphor portion 2084 increases, a filling space of the phosphor portion may be further secured compared to the prior art. In this instance, the particle size of phosphor filled into the phosphor portion may have a size of 3 to 15 micrometers.

Further, in case of the second partition wall portion 2087, it may be formed to be broken for each pixel. Through this, in case of a connected space, light may be guided to prevent or mitigate light from being interfered with other pixels. More specifically describing the structure of the partition wall portions 2085, at least one of the plurality of partition wall portions 2085 may include one or more metal thin films 2088 formed at an edge thereof, and a light transmitting material 2089 may be formed to fill between the metal thin films 2088.

As a material having a high transmittance in a visible light region, an epoxy-based photoresist (PR), polydimethylsiloxane (PDMS), resin or the like may be used for the light transmitting material 2089, for example. The materials are suitable for the material of the partition wall portion applied to a flexible display since they do not have hardening properties at high temperatures. For example, the metal thin films 2088 are configured to cover a lateral surface of the plurality of phosphor portion 2084 to reflect light.

The metal thin films 2088 may include a first metal thin film 2088a disposed at one edge of the partition wall portions 2085 and a second metal thin film 2088b disposed at the other edge thereof. The first metal thin film 2088a and second metal thin film 2088b may have a thickness of 50 to 100 nanometers, respectively. More specifically, the first metal thin film 2088a and second metal thin film 2088b may be configured to have 100 to 200 nanometers, respectively.

The metal thin films 2088 may not exist at an upper and lower end of the partition wall portion. In other words, the first metal thin film 2088a and 2099b are configured to be separated from each other along a width direction of the partition wall portion. Through this structure, light passing through a light transmitting material may be emitted to the outside from an upper end of the partition wall portion.

The first metal thin film 2088a and second metal thin film 2088b are formed of a metal material such as aluminum, silver or the like having a high reflectivity in a visible light region to reflect light, thereby preventing color mixture between phosphor portions. However, the present disclosure is not limited to this, and for example, the metal thin film may be replaced with an oxide thin film such as TiOx, CrOx or the like, or a distributed Bragg reflector (DBR) structure may be applicable thereto.

Figure 18A:
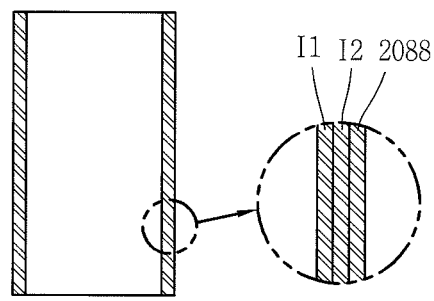
FIGS. 18A and 18B are cross-sectional views illustrating modified examples of partition wall portions, respectively, in FIG. 15.

The metal thin films 2088 may be formed of a single metal film as illustrated in the drawing, but the present disclosure is not limited to this. For example, the metal thin films 2088 may be formed of a multi-layered metal thin film as illustrated in FIG. 18A. As illustrated in the drawing, a metal thin film (I1, I2) with another material for enhancing oxidation protection and adhesion may be formed on one surface of the metal thin film 2088. In this instance, titanium, nickel, chromium or the like may be used for another material.

Figure 18B:
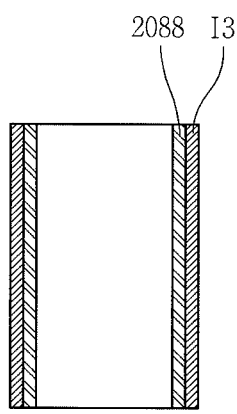

In another example, an insulating layer 12 may be formed between the metal thin film 2088 and the light transmitting material as illustrated in FIG. 18B. The insulating layer (I3) may be formed of a non-light transmitting material, and such an example, $SiO_2$, SiNx or the like may be used. For still another example, the insulating layer (2) may be a black matrix. In this instance, the black matrix may exert an additional effect of resulting in contrast enhancement.

Referring to FIG. 16A again, the plurality of partition wall portions 2085 are formed with a partially protruded shape on a plane. Due to such a shape, the deposition level of the metal thin films 2088 may be controlled. More specifically, as illustrated in FIGS. 16B through 16E, a lower portion of the partition wall portions 2085 is hidden in a deposition direction, and thus a portion at which the metal thin film 2088 is not disposed occurs at a lower portion of the partition wall portions 2085. Through this, it is possible to prevent a leakage path due to a short between the second electrode 2040 and the metal thin film 2088 from being occurred.

More specifically, at least one of the plurality of partition wall portions 2085 may include a base portion 2085a and a protrusion portion 2085b. The metal thin film 2088 may be disposed at an edge of the plurality of partition wall portions 2085, and thus the metal thin film 2088 may include a base portion 2088a and a protrusion portion 2088b similarly to the partition wall portions 2085.

The base portion 2085a is extended along a first direction, and the protrusion portion 2085b is protruded in a second direction perpendicular to the first direction from an end portion of the base portion 2085a. The first direction is a direction of extending one phosphor portion formed with the same color, and the second direction may be a direction of sequentially disposing red (R), green (G) and blue (B) pixels.

Due to the protrusion portion 2085b, a metal thin film (or base portion with a metal thin film) 2088a formed on the base portion 2085a and a metal thin film (or protrusion portion with a metal thin film) 2088b formed on the 2085b may be formed to have different lengths along a thickness direction of the phosphor layer 2080. More specifically, a distance to the substrate from the metal thin film (or protrusion portion with a metal thin film) 2088b formed on the 2085b may be configured to be larger than that from the metal thin film (or base portion with a metal thin film) 2088a formed on the base portion 2085a.

In this instance, the protrusion portion is disposed to overlap with at least part of a wiring electrode of the semiconductor light emitting device in a thickness direction of the phosphor layer 2080. For example, the second direction may be a direction in parallel to the second electrode 2040 disposed at an upper portion based on the conductive adhesive layer 2030. Due to such a structure, a separation distance between the second electrode 2040 and the metal thin film (or protrusion portion with a metal thin film) 2088b formed on the protrusion portion can be sufficiently secured.

Figure 17:
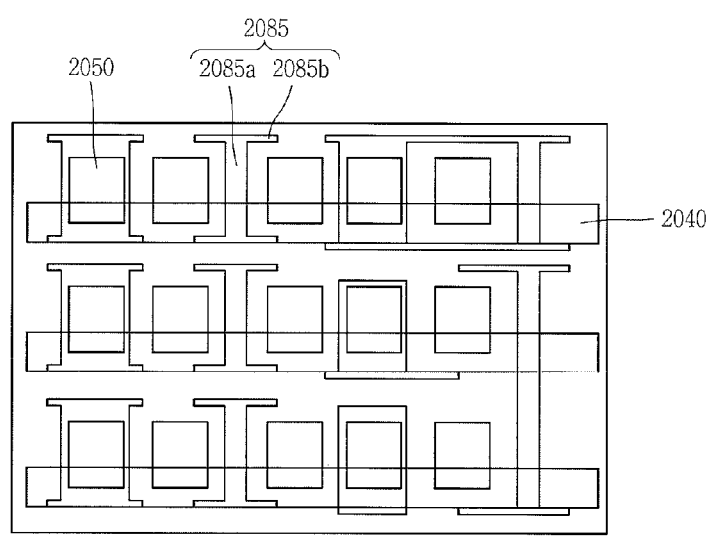
FIG. 17 is a plan view illustrating modified examples of partition wall portions in FIG. 16.

Referring to FIG. 17 along with FIG. 16A, at least one of the plurality of partition wall portions 2085 is separated from an adjoining partition wall portion along the first direction or the second direction. It is to secure flexible properties. In this instance, in order to enhance rigidity, at least part of the protrusion portion 2085b may be connected to a protrusion portion of the adjoining partition wall portion. Thus, the protrusion portion may be used as various structures, such as forming a block structure being connected to each other, forming one-sided protruding structure formed only at one side of the partition wall portions to block only one side, and the like. Furthermore, part of the protrusion portion 2085b is separated from or connected to the adjoining protrusion portion, thereby enhancing design freedom for securing both flexible properties and rigidity.

According to a new phosphor layer structure as described above, a partition wall portion suitable to a display having flexible characteristics may be implemented. Hereinafter, a method of fabricating a new phosphor layer structure as described above will be described in more detail with reference to the accompanying drawings. FIGS. 19A to 20E are cross-sectional views illustrating a fabrication method of a display device using a semiconductor light emitting device according to the present disclosure, and FIG. 21 is a conceptual view illustrating a concept of depositing a metal thin film in FIG. 20B, and FIGS. 22A to 22D are conceptual views illustrating another embodiment of a fabrication method for generating a metal thin film.

Figure 19A:
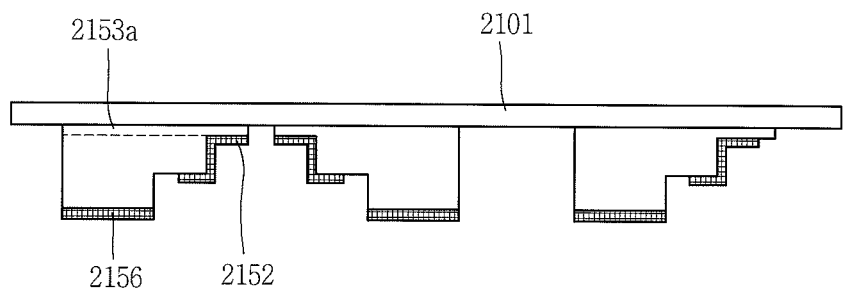
FIGS. 19A to 20E are cross-sectional views illustrating a fabrication method of a display device using a semiconductor light emitting device according to the present disclosure.
Figure 19B:
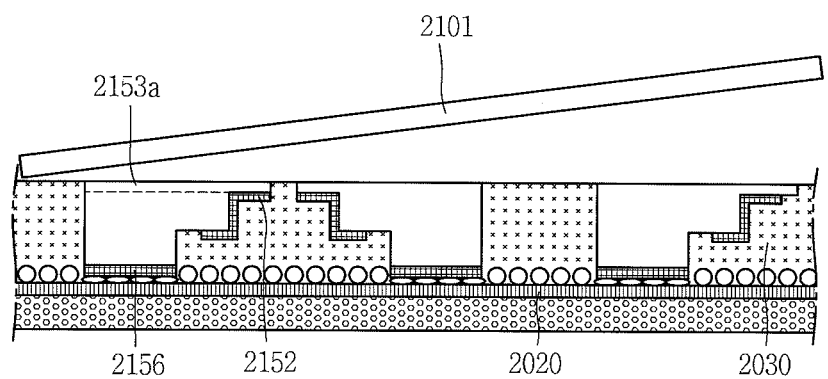
Figure 19C:
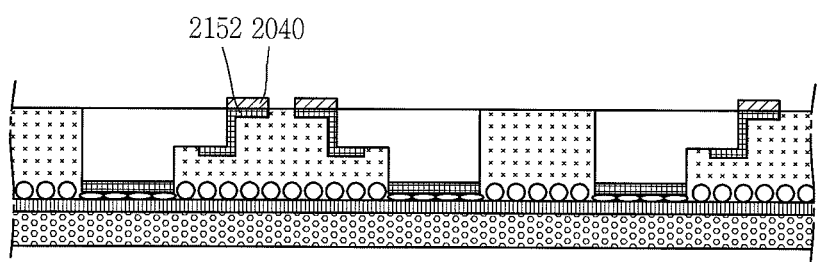
Figure 20A:
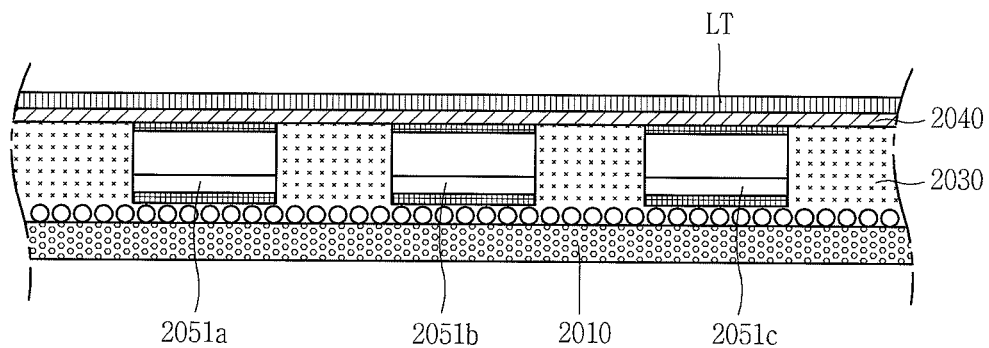
Figure 20B:
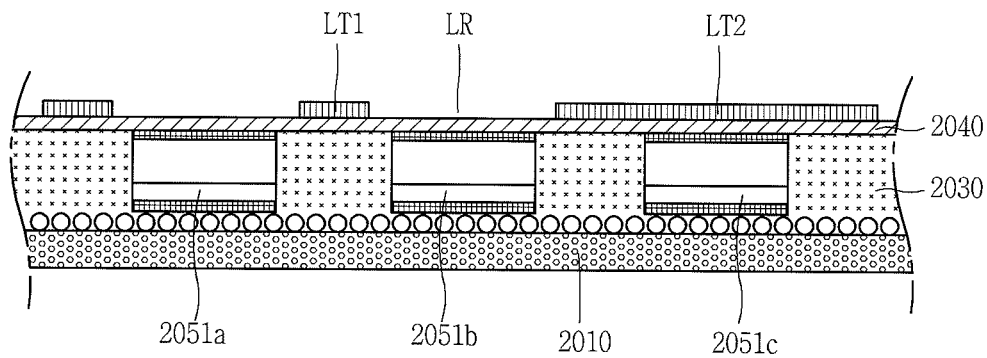

FIGS. 19A to 19C are views illustrating a fabrication method of a display device using a semiconductor light emitting device according to the present disclosure with reference to cross-sectional views seen in a direction of line G-G of FIG. 13, and 20A to 20E are views illustrating a fabrication method of a display device using a semiconductor light emitting device according to the present disclosure with reference to cross-sectional views seen in a direction of line H-H of FIG. 13.

First, according to the fabrication method, the process of coupling a plurality of semiconductor light emitting devices to a substrate is performed. For example, For example, a first conductive semiconductor layer, an active layer and a second conductive semiconductor layer are grown on a growth substrate, and each semiconductor light emitting device is created through etching, and then a first conductive electrode 2156 and a second conductive electrode 2152 are formed (FIG. 19A).

The growth substrate 2101 (wafer) may be formed of a material having light transmitting properties such as any one of sapphire ($Al_2O_3$), GaN, ZnO and AlO, but is not limited to this. Furthermore, the growth substrate 2101 may be formed of a material suitable to semiconductor material growth, carrier wafer. The growth substrate 2101 may be formed of a material having a high thermal conductivity, and use a SiC substrate having a thermal conductivity higher than that of the sapphire substrate ($Al_2O_3$) or at least one of Si, GaAs, GaP, InP and $Ga_2O_3$ including a conductive substrate or insulating substrate.

The first conductive electrode 2156 and first conductive semiconductor layer may be a p-type electrode and a p-type semiconductor layer, respectively, and the second conductive electrode 2152 and second conductive semiconductor layer may be an n-type electrode and an n-type semiconductor layer, respectively. However, the present disclosure is not limited to this, and may also have an illustration in which the first conductive type is an n-type and the second conductive type is a p-type.

In this instance, as described above, at least part of the second conductive electrode 2152 is protruded from a lateral surface of the second conductive semiconductor layer (or a lateral surface of the undoped semiconductor layer 2153a).

Next, the flip chip type semiconductor light emitting device is coupled to a wiring substrate suing the conductive adhesive layer 2030, and the growth substrate is removed (FIG. 19B). The wiring substrate includes the first electrode 2020 formed thereon, and the first electrode 2020, as a lower wiring layer, is electrically connected to the first conductive electrode 2156 by a conductive ball or the like within the conductive adhesive layer 2030.

Then, the undoped semiconductor layer 2153a is etched and removed, and then the second electrode 2040 connected to the protruded second conductive electrode 2152 is formed (FIG. 19C). As an upper wiring layer, the second electrode 2040 is directly connected to the second conductive electrode 2152.

However, the present disclosure is not limited to this, and the undoped semiconductor layer may be replaced with another type of absorption layer for absorbing UV laser. The absorption layer may be a buffer layer, and formed in a low temperature atmosphere, and made of a material capable of alleviating a lattice constant difference between the semiconductor layer and the growth substrate. For example, the absorption layer may include a material such as GaN, InN, AlN, AlInN, InGaN, AlGaN, and InAlGaN.

Next, a phosphor layer disposed to cover the plurality of semiconductor light emitting devices is formed. The phosphor layer may include a plurality of phosphor portions for converting the wavelength of light and a plurality of partition wall portions formed between the plurality of phosphor portions. In this instance, at least one of the plurality of partition wall portions may overlap with at least one of the plurality of semiconductor light emitting devices along a thickness direction of the phosphor layer.

According to the drawing, the process of forming a partition wall portion may be performed. Referring to FIG. 20A, a light transmitting material (RT) is coated on the plurality of semiconductor light emitting devices. As a material having a high transmittance in a visible light region, as described above, an epoxy-based photoresist (PR), polydimethylsiloxane (PDMS), resin or the like may be used for the light transmitting material (RT).

Then, the process of etching the light transmitting material, and filling a phosphor into a portion (LR) from which the light transmitting material (RT) is etched to create the phosphor portions is performed. More specifically, referring to FIG. 20B, the light transmitting material (RT) is etched, and in this instance, the light transmitting material (RT) is non-etched on a portion corresponding to at least one of the plurality of semiconductor light emitting devices. In other words, due to the etching, the light transmitting material (RT) may be partitioned into a portion (LT1) disposed to cover between the plurality of semiconductor light emitting devices and a portion (LT2) disposed to cover at least one of the plurality of semiconductor light emitting devices.

In this instance, the plurality of partition wall portions may be etched in a shape including base portions and protrusion portions. For example, the etched light transmitting material may include a protrusion portion protruded from an end portion of the base portion to hide at least part of the light transmitting material along a deposition direction of the metal thin film.

Figure 20C:
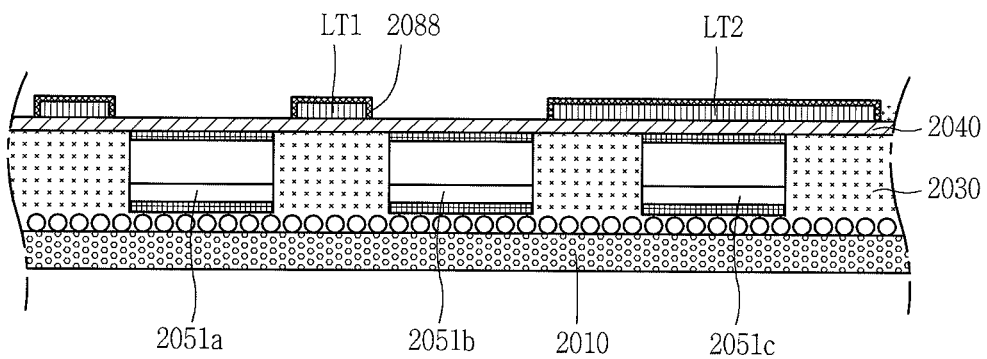
Figure 21:
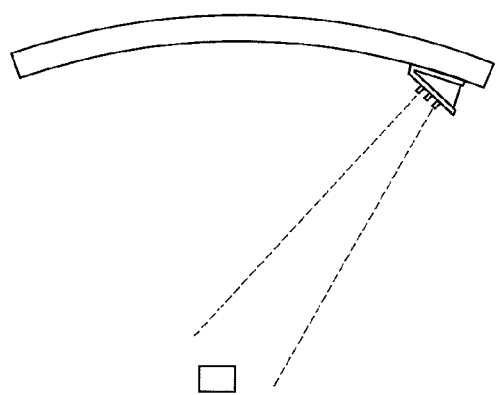
FIG. 21 is a conceptual view illustrating a concept of depositing a metal thin film in FIG. 20B.

Referring to FIG. 20C, the process of etching the light transmitting material, and then etching the metal thin film 2088 on the light transmitting material (RT) is performed. In this instance, the metal thin films 2088 may be deposited on an entire outer surface of the light transmitting material (RT) using a deposition technology or sputter. The metal thin film may be formed of a metal material such as such as aluminum, silver or the like having a high reflectivity in a visible light region as described above.

In this instance, the deposition may be performed in a direction having an inclination with respect to a thickness direction of the display device. As illustrated in FIG. 21, according to the protrusion portion, the hidden extent may be controlled using an inclination angle, and thus the protruding extent of the protrusion portion may be controlled to control the length of the metal thin film. Meanwhile, the inclination angle equal to or greater than 25 degrees may be used.

Using the foregoing method, a separation distance between the second electrode 2040 and the metal thin film (or protrusion portion with a metal thin film) 2088b may be secured. Furthermore, deposition is performed in an inclined direction, and thus the process of performing deposition with respect to one lateral surface of the light transmitting material in one direction and then rotating the display to deposit the other lateral surface (opposite lateral surface) may be used.

Figure 20D:
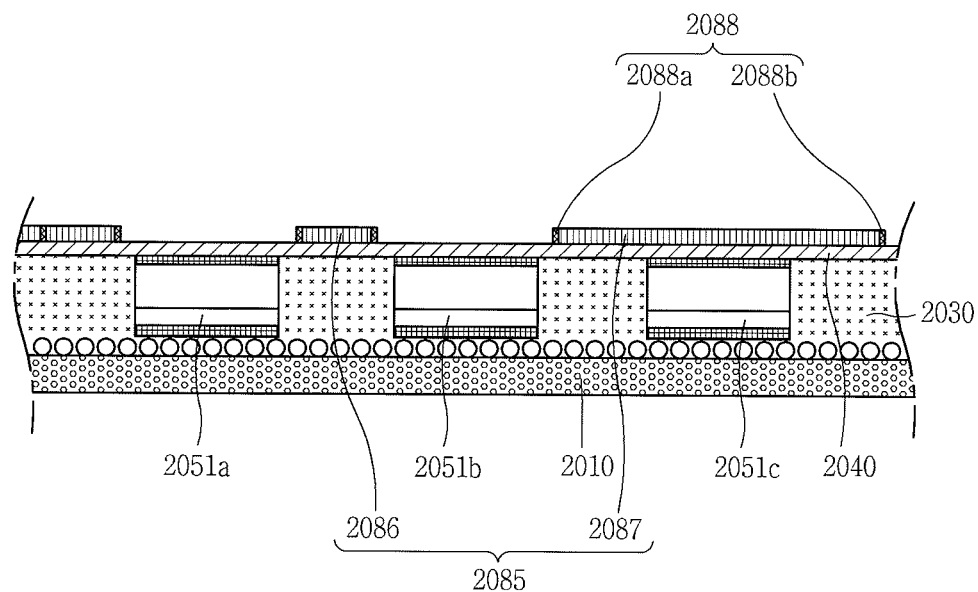

Then, at least part of the metal thin film is removed to transmit light emitted from the semiconductor light emitting device to a portion corresponding to at least one of the plurality of semiconductor light emitting devices (refer to FIG. 20D). For example, a metal thin film may be removed from an upper surface (a surface which is the farthest from the semiconductor light emitting device) of the partition wall portion, and in this case an upper portion of the metal thin film may be removed by dry etching to minimize an effect on the semiconductor light emitting device.

Figure 20E:
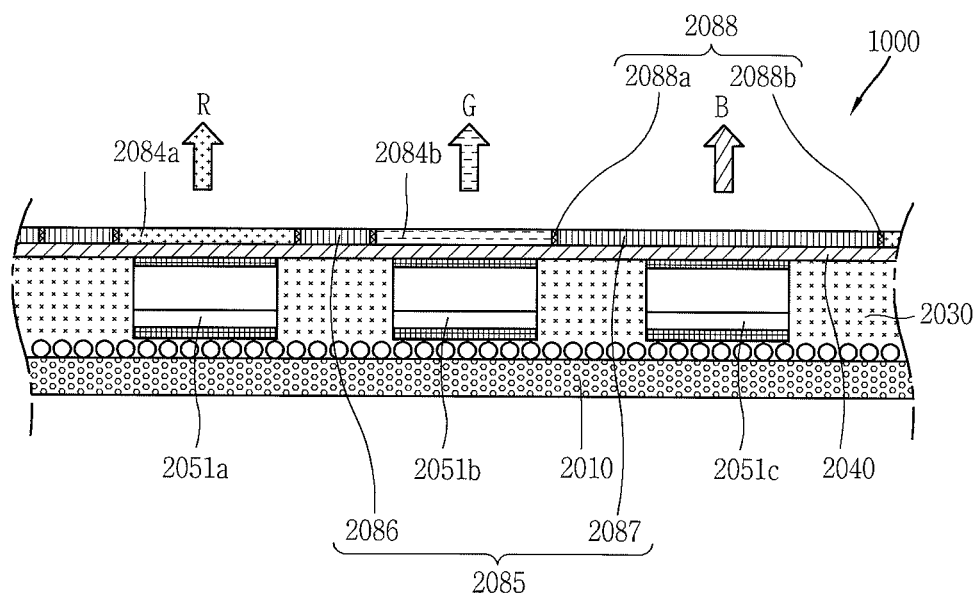

Next, as illustrated in FIG. 20E, a phosphor is filled between the light transmitting materials deposited with the metal thin films to create the phosphor portion. For an example of creating the phosphor portion, first, a method of coating and developing a photoresist and then sequentially coating a red phosphor and a green phosphor may be used. In another example, a method of filling a yellow phosphor between the light transmitting materials deposited with the metal thin films, and then adhering a color filter repeated with red, green and blue thereto may be used. In this instance, the phosphor portion may be combined with the color filter to implement red, green and blue sub-pixels.

Further, the metal thin film may be a structure in which an upper portion is not removed from a portion of the light transmitting material disposed to cover between the plurality of semiconductor light emitting devices. According to the fabrication method, first, as illustrated in FIG. 20B, the light transmitting material is etched, and in this instance, the light transmitting material is non-etched on a portion corresponding to at least one of the plurality of semiconductor light emitting devices. In other words, the light transmitting material may be partitioned into a portion disposed to cover between the plurality of semiconductor light emitting devices and a portion disposed to cover at least one of the plurality of semiconductor light emitting devices.

Figure 22A:
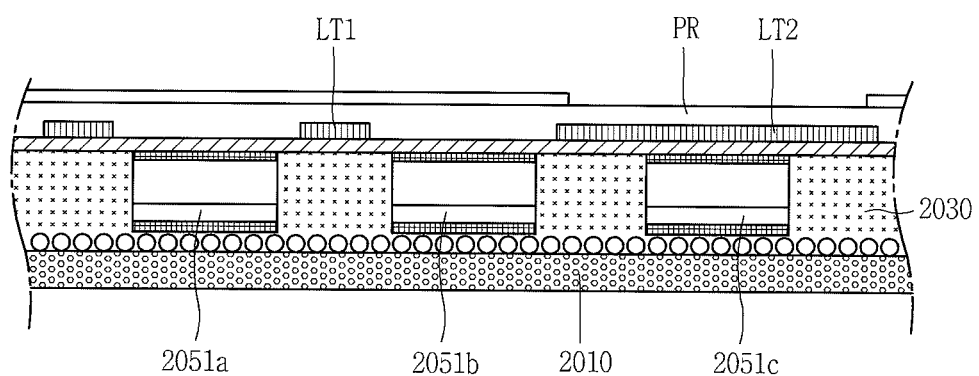
FIGS. 22A to 22D are conceptual views illustrating another embodiment of a fabrication method for generating a metal thin film.
Figure 22B:
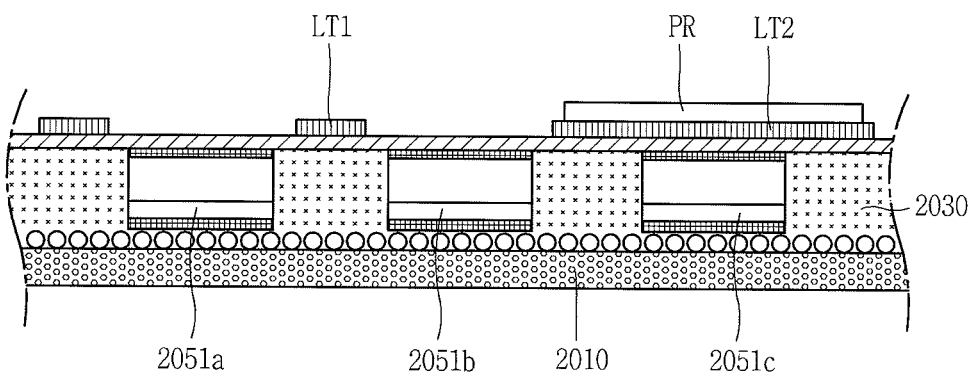
Figure 22C:
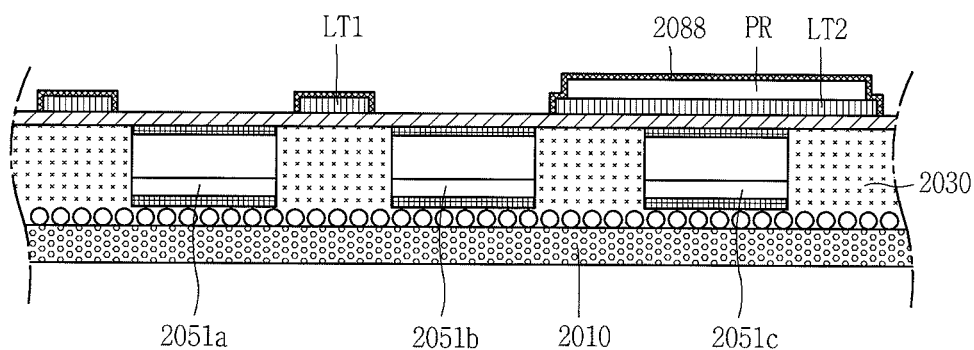
Figure 22D:
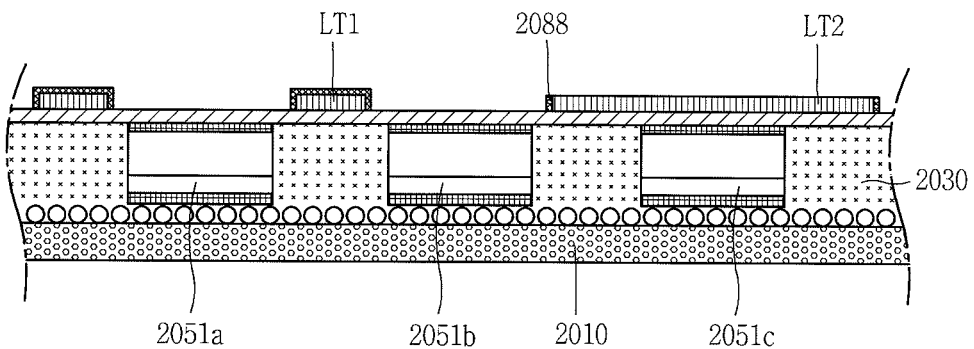

Then, the photoresist (PR) is patterned through photolithography (FIG. 22A), and the photoresist is remained on a portion disposed to cover at least one of the plurality of semiconductor light emitting devices due to development and the remaining portion is removed (FIG. 22B). Then, a metal thin film is deposited on the light transmitting material (FIG. 22C), and the metal thin film is removed from a portion disposed to cover between the plurality of semiconductor light emitting devices using lift-off (FIG. 22D).

According to such a method, the metal thin film may be removed from an upper surface (which is the farthest from the semiconductor light emitting device) of the partition wall portion covering the semiconductor light emitting device, and maintained on the remaining portion to cover the entire outer surface of the light transmitting material. Thus, it is possible to further increase reflection efficiency. In the above, a method of fabricating a phosphor layer according to the present disclosure has been described. Meanwhile, the structure of a phosphor layer according to the present disclosure may be modified in various forms, and such a variety of embodiments will be described below.

Figure 23A:
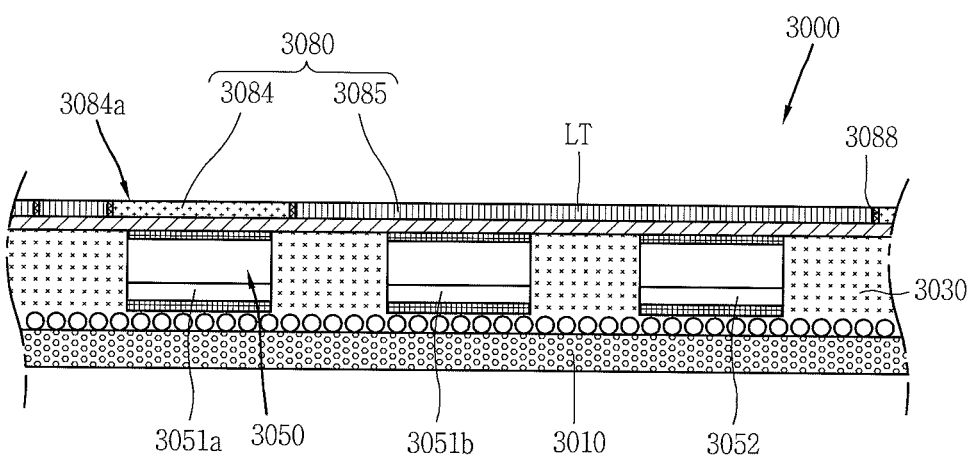
FIGS. 23A and 23B are conceptual views illustrating various forms for implementing colors in connection with a flip chip type semiconductor light emitting device to which the present disclosure is applied.
Figure 23B:
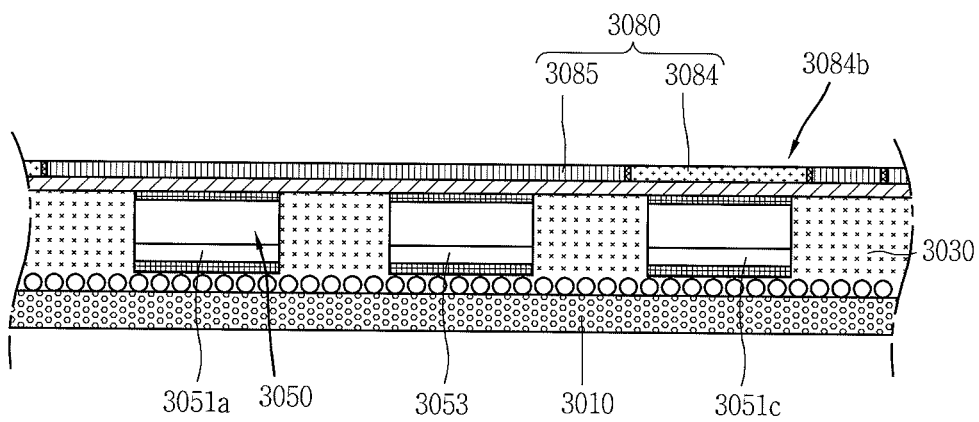

FIGS. 23A and 23B are conceptual views illustrating various forms for implementing colors in connection with a flip chip type semiconductor light emitting device to which the present disclosure is applied. According to the present example which will be described below, the same or similar reference numerals are designated to the same or similar configurations to each configuration of the foregoing example described with reference to FIGS. 13 through 22D, and the description thereof will be substituted by the earlier description.

For example, the display device 3000 may include a substrate 3010, a first electrode, a conductive adhesive layer 3030, a second electrode 3040 and a plurality of semiconductor light emitting devices 3050, and the description thereof will substituted by the description with reference to FIGS. 13 through 22D. Accordingly, the conductive adhesive layer 3030 according to the present embodiment may be replaced with an adhesive layer, and adhered to an adhesive layer in which a plurality of semiconductor light emitting devices are disposed on the substrate 3010, and the first electrode may be integrally formed with a conductive electrode of the semiconductor light emitting device without being located on the substrate 3010.

The second electrode 3040 may be located on the conductive adhesive layer 3030. In other words, the conductive adhesive layer 3030 is disposed between the wiring substrate and the second electrode 3040. The second electrode 3040 may be electrically connected to the plurality of semiconductor light emitting devices 3050 by contact therewith.

As described above, the display device 3000 may include a phosphor layer 3080 disposed to cover the plurality of semiconductor light emitting devices 3050. According to the drawing, the phosphor layer 3080 may include a plurality of phosphor portions 3084 for converting the wavelength of light and a plurality of partition wall portions 3085 formed between the plurality of phosphor portions 3084.

More specifically describing the structure of the partition wall portions 3085, at least one of the plurality of partition wall portions 3085 may include one or more metal thin films 3088 formed at an edge thereof, and a light transmitting material (LT) may be formed to fill between the metal thin films 3088. As a material having a high transmittance in a visible light region, an epoxy-based photoresist (PR), polydimethylsiloxane (PDMS), resin or the like may be used for the light transmitting material (LT), for example. The materials are suitable for the material of the partition wall portion applied to a flexible display since they do not have hardening properties at high temperatures.

For example, the metal thin films 3088 are configured to cover a lateral surface of the plurality of phosphor portion 3084 to reflect light. The metal thin films 3088 may not exist at an upper and lower end of the partition wall portion. Through this structure, light passing through a light transmitting material may be emitted to the outside from an upper end of the partition wall portion.

Referring to the present drawings, the partition wall portions 3085 may be configured to cover a pair of semiconductor light emitting devices disposed adjacent to each other together among the plurality of semiconductor light emitting devices 3051a, 3051b, 3052. More specifically, the plurality of semiconductor light emitting devices may include at least one semiconductor light emitting device 3051a configured to form red (R), green (G) and blue (B) sub-pixels along with the pair of semiconductor light emitting devices 3051b, 3052, and at least one of the plurality of phosphor portions 3084 is configured to cover the at least one semiconductor light emitting device 3051a.

For example, the semiconductor light emitting device 3050 may include a blue semiconductor light emitting device 3051b for emitting blue (B) light, and a green semiconductor light emitting device 3052 for emitting green (G) light, and the partition wall portion is configured to cover the blue semiconductor light emitting device 3051b and green semiconductor light emitting device 3052 at the same time. Accordingly, blue (B) light and green (G) light may be implemented on the partition wall portions 3085. Meanwhile, a red phosphor portion 3084a filled with a red phosphor is formed between the partition wall portions 3085, and the blue semiconductor light emitting device 3051a may be disposed at a lower portion of the red phosphor portion 3084a.

Thus, according to an embodiment of the present illustration, the red phosphor portion 3084a and partition wall portions 3085 are sequentially arranged along one direction, and the red phosphor portion 3084a emits red light and the partition wall portions 3085 emit green and blue light. In another example, referring to FIG. 23B, the semiconductor light emitting device 3050 may include a blue semiconductor light emitting device 3051b for emitting blue (B) light, and a red semiconductor light emitting device 3053 for emitting red (R) light, and the partition wall portion 3085 is configured to cover the blue semiconductor light emitting device 3051b and red semiconductor light emitting device 3053 at the same time. Accordingly, blue (B) light and red (R) light may be implemented on the partition wall portions 3085. Meanwhile, a green phosphor portion 3084b filled with a green phosphor is formed between the partition wall portions 3085, and the blue semiconductor light emitting device 3051c may be disposed at a lower portion of the green phosphor portion 3084b.

According to such a structure, the green phosphor portion 3084b and partition wall portions 3085 are sequentially arranged along one direction, and the green phosphor portion 3084*b* emits green light and the partition wall portions 3085 emit red and blue light.

The configurations and methods according to the above-described embodiments will not be applicable in a limited way to the foregoing display device using a semiconductor light emitting device, and all or part of each embodiment may be selectively combined and configured to make various modifications thereto.

What is claimed is:

1. A display device, comprising:
 a plurality of semiconductor light emitting devices mounted on a substrate; and
 a phosphor layer including a plurality of phosphor portions configured to convert a wavelength of light and a plurality of partition wall portions formed between the plurality of phosphor portions,
 wherein at least one of the plurality of partition wall portions overlaps with at least one of the plurality of semiconductor light emitting devices along a thickness direction of the phosphor layer, and
 wherein the at least one of the plurality of partition wall portions comprises metal thin films formed at edges thereof, and a light transmitting material is filled between the metal thin films.

2. The display device of claim 1, wherein the plurality of partition wall portions comprise a first partition wall portion disposed between the plurality of semiconductor light emitting devices and a second partition wall portion configured to cover the at least one of the plurality of semiconductor light emitting device.

3. The display device of claim 2, wherein the at least one of the plurality of semiconductor light emitting devices covered by the second partition wall portion comprises a blue semiconductor light emitting device.

4. The display device of claim 3, wherein at least part of the plurality of phosphor portions is disposed with the first partition wall portion therebetween, and the at least part of phosphor portions comprises at least one of a red phosphor, a green phosphor and a yellow phosphor.

5. The display device of claim 2, wherein the first partition wall portion and the second partition wall portion have different sizes of width formed along a direction perpendicular to a thickness direction of the phosphor layer.

6. The display device of claim 5, wherein the first partition wall portion has a size of width smaller than that of the second partition wall portion.

7. The display device of claim 1, wherein the plurality of partition wall portions cover a pair of semiconductor light emitting devices disposed adjacent to each other among the plurality of semiconductor light emitting devices.

8. The display device of claim 7, wherein the plurality of semiconductor light emitting devices comprise at least one semiconductor light emitting device forming red (R), green (G) and blue (B) sub-pixels along with the pair of semiconductor light emitting devices, and
 wherein at least one of the plurality of phosphor portions covers the at least one semiconductor light emitting device.

9. The display device of claim 1, wherein the metal thin films cover a lateral surface of the phosphor portions to reflect light from the metal thin films.

10. The display device of claim 1, further comprising:
 an insulating layer formed between the metal thin films and the light transmitting material.

11. The display device of claim 1, wherein at least one of the plurality of partition wall portions comprises:
 a base portion extended along a first direction; and
 a protrusion portion protruded in a second direction perpendicular to the first direction from an end portion of the base portion.

12. The display device of claim 11, wherein a metal thin film formed on the base portion and a metal thin film formed on the protrusion portion have different lengths along a thickness direction of the phosphor layer.

13. The display device of claim 12, wherein a distance to the substrate for a metal thin film formed on the protrusion portion is greater than that for a metal thin film formed on the base portion.

14. The display device of claim 11, wherein the protrusion portion overlaps with at least part of a wiring electrode of the semiconductor light emitting device in a thickness direction of the phosphor layer.

15. The display device of claim 11, wherein at least one of the plurality of partition wall portions is separated from an adjoining partition wall portion along the first direction or the second direction.

* * * * *